(12) United States Patent
Miyazaki

(10) Patent No.: US 6,498,517 B2
(45) Date of Patent: Dec. 24, 2002

(54) PEAK HOLD CIRCUIT

(75) Inventor: Keizo Miyazaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/994,862

(22) Filed: Nov. 28, 2001

(65) Prior Publication Data

US 2002/0067190 A1 Jun. 6, 2002

(30) Foreign Application Priority Data

Dec. 6, 2000 (JP) ............................. 2000-372047

(51) Int. Cl.[7] .................... G01R 19/00; G11C 27/02
(52) U.S. Cl. .................... 327/59; 327/58; 327/95; 327/94
(58) Field of Search ..................... 327/58–62, 91, 327/94, 95, 96; 323/315, 313

(56) References Cited

U.S. PATENT DOCUMENTS 4,321,488 A * 3/1982 Srivastava ................. 327/58
6,356,065 B1 * 3/2002 Miyazaki ................. 323/315

* cited by examiner

*Primary Examiner*—Toan Tran
(74) *Attorney, Agent, or Firm*—Fitzpatrick, Cella, Harper & Scinto

(57) ABSTRACT

Disclosed is a peak hold circuit wherein output current corresponding to the peak value of input current is obtained for input currents with little change in magnitude, at essentially higher speeds. Detected drain current and input current of a P-MOS FET are compared, a first reference potential is applied to an NPN transistor, and a second reference potential lower than the first reference potential by a predetermined voltage such that the NPN transistor and a PNP transistor are not simultaneously turned on, is applied to the PNP transistor. In the event that the detected current is greater than the drain current, the NPN transistor is turned on and the PNP transistor is turned off, in the event that the detected current is smaller than the drain current, the NPN transistor is turned off and the PNP transistor is turned on, and in the event that the detected current and the drain current are equal, the NPN transistor and the PNP transistor are both turned off.

10 Claims, 26 Drawing Sheets

PEAK HOLD CIRCUIT

BACKGROUND OF THE INVENTION

1. Field of the Invention

The present invention relates to a peak hold circuit, and particularly relates to a current mode peak hold circuit wherein output current corresponding to the peak value of input current can be obtained even for input currents with little change in magnitude, at essentially higher speeds.

2. Description of the Related Art

An example of a conventionally-known peak hold circuit wherein output voltage corresponding to peak values of input voltage can be obtained is shown in FIG. 25. The voltage of the non-inverting input terminals of an operational amplifier 2502 (equal to the voltage VH held by a capacitor 2507) is initially equal to the voltage VIN1 of the non-inverting input terminals of an operational amplifier 2501.

Thus, the voltage of the output terminal of the operational amplifier 2502, the voltage of the inversion input terminal of the operational amplifier 2501, and the voltage of the output terminal of the operational amplifier 2501 are VH which is VIN1, the voltage at both ends of the diodes 2503 and 2504 are zero, with the diodes 2503 and 2504 being in a non-conducting state.

In this state, even in the event that the voltage of the input terminal 2508 rises and reaches VIN2, the diode 2503 is in a non-conducting state, so the output voltage of the operational amplifier 2501 rises greatly regardless of the negative feedback. Then, when forward voltage is applied to the diode 2504 an the diode 2504 is in a conducting state, the capacitor 2507 is charged, the voltage at both ends of the capacitor 2507 rises, and in the same manner, the voltage of the output terminal 2509 of the operational amplifier 2502 and the voltage of the inverted input terminals of the operational amplifier 2503 rise.

Then, at the point that the voltage at both ends of the capacitor 2507 is equal to the voltage VIN2 of the output terminal 2509 of the operational amplifier 2501, the diode 2504 enters a non-conducting state, and consequently, the voltage VIN2 is held by the capacitor 2507.

In the event that the voltage of the input terminals 2508 drops and changes from VIN2 to VIN3 in this state, while the output voltage of the operational amplifier 2501 drops, the voltage at both ends of the capacitor 2507 (i.e., the held voltage VH) is VIN2, so inverse voltage is applied to both ends of the diode 2504, so the diode 2504 remains in a non-conducting state, and the held voltage VH remains unchanged at VIN2.

Thus, voltage corresponding to the peak value of he input voltage of the input terminals 2508 is output at the output terminal 2509.

However, such voltage mode peak hold circuits are configured of multiple operational amplifiers, diodes, capacitors, and so forth, so the circuit tends to become large in size.

Also, the circuit is arranged so as to make input to the peak hold circuit shown in FIG. 25 following converting the input current into voltage values with a current/voltage converting circuit, so there is a limit to how far the size of the circuit can be reduced, and the circuit has not been able to be reduced in size any further.

A known example of a peak hold circuit which has solved such problems is described in Japanese Patent Application No. 10-5449. This peak hold circuit is known as a current mode peak hold circuit, and has a configuration such as shown in FIG. 26.

FIG. 26 will now be described. This current mode peak hold circuit is configured of P-MOS transistors 2601 and 2602, an NPN transistor 2603, and a PNP transistor 2607. The gates of the P-MOS transistors 2601 and 2602 are connected in common, and the sources are connected to the electric power source VDD. The P-MOS transistor 2601 has the drain thereof connected to the terminal 2604, and the NPN transistor 2602 has the drain thereof connected to the terminal 2606. The collector of the NPN transistor 2603 is connected to the gates of the P-MOS transistor 2601 and 2602 connected in common, the emitter thereof is connected to the drain of the P-MOS transistor 2601, and the base is connected to a reference potential VBIAS1. The emitter of the PNP transistor 2607 is connected to the drain of the P-MOS 26501, the base the base is connected to a reference potential VBIAS2, and the collector is grounded.

The reference potential VBIAS1 and the reference potential VBIAS2 are lower than the voltage of the electric power source VDD but higher than the ground potential, are a potential such that the NPN transistor 2603 and the PNP transistor 2607 do not turn on simultaneously, and the difference potential between the reference potential VBIAS1 and the reference potential VBIAS2 is 0.7 V, for example.

In FIG. 26, V4(t) represents the absolute potential of the terminal 2604 at time t, iD1(t) represents the drain current of the P-MOS transistor 2601 at time t, iin(t) represents input current at time t, and iout(t) is output current at time t, with the direction of the arrows being the forward direction for each. Note that iout(t) matches the drain current of the P-MOS transistor 2602.

(1) Let us say that the P-MOS transistor 2601 is operated at saturation range, and the drain current iD1(t) and input current iin(t) of the P-MOS transistor 2601 match. In this state, the potential of the terminal 2604 is generally the average potential of the two reference potentials VBIAS1 and VBIAS2, the voltage between the base and emitter of the NPN transistor 2603 and PNP transistor 2607 are both around 0.35 V, and both the NPN transistor 2603 and PNP transistor 2607 are in the cut-off state.

In the event that the input current iin(t) increases over a period from time t0 to time t1 as shown in FIG. 27A for example, the relation between the drain current iD1(t) and input current iin(t) of the P-MOS transistor 2601 becomes that represented by iD1(t)<iin(t), and the voltage of the terminal 2604 drops.

The PNP transistor 2607 maintains the cut-off state, but at the point that the voltage of the terminal 2604 drops around 0.5 V as to the reference potential VBIAS1, the NPN transistor 2603 enters the forward activation range and begins to cause current to flow, and at the point that the voltage of the terminal 2604 drops around 0.7 V as to the reference potential VBIAS1, the NPN transistor 2603 turns on.

At the point that the NPN transistor 2603 turns on, the difference current between the input current and the drain current iD1(t) of the P-MOS transistor 2601, i.e., iin(t)–iD1(t), flows from the node 2605 to the terminal 2604 via the NPN transistor 2603, and the voltage of the node 2605 drops so that the input current iin(t) and the drain current iD1(t) of the P-MOS transistor 2601 are equal. The voltage drop of this node 2605 is generated by charge being extracted from the parasitic capacity between the gate sources of the P-MOS transistors 2601 and 2602 connected to the node 2605, via the NPN transistor 2603. At this time, the peak hold circuit shown in FIG. 26 acts as a current mirror circuit, and output current proportionate to the input current is obtained (see FIG. 27B).

(2) In the event that the increase of the input current iin(t) stops over a period from time t1 to time t2 as shown in FIG. 27A for example, iD1(t) = iin(t), and the NPN transistor 2603 and PNP transistor 2607 are both in the cut-off state, so the voltage of the terminal 2604 rises, and the voltage of the terminal 2604 settles down at around the average potential of the two reference potentials VBIAS1 and VBIAS2. At this time, the node 2605 is in a high-impedance state, so the charge at time t1 at the parasitic capacity between the gate sources of the P-MOS transistors 2601 and 2602 does not change.

On the other hand, the voltage between the gate sources of the P-MOS transistors 2601 and 2602 is maintained at VGS(t1), and output current iout(t) proportionate to the input current iin(t1) at time t1 is maintained (see FIG. 27B).

(3) In the event that the input current iin(t) at time t is smaller than the input current iin(t1) at time t1 in a period from time t2 to time t3 as shown in FIG. 27A for example, voltage of the terminal 2604 further rises, but the NPN transistor 2603 maintains the cut-off state, so the voltage VGS(t1) between the gate sources of the P-MOS transistors 2601 and 2602 is maintained, and the value of the output current iout(t) at time t1 is maintained. Then, at the point that the voltage of the terminal 2604 rises around 0.7 V as to the reference potential VBIAS2, the PNP transistor 2607 enters the forward activation range and turns on, and the difference current between the drain current iD1(t) of the P-MOS transistor 2601 and the input current, i.e., iD1(t)−iin(t), in other words the difference current between the input current at time t1 and the input current at time t, i.e., iin(t1)−iin(t), flows.

(4) In the event that current exceeding the current iin(t1) at time t1 is input in a period from time t3 to time t4 as shown in FIG. 27A for example, and the current continues to increase, the voltage of the terminal 2604 drops, and at the point that the voltage of the terminal 2604 drops around 0.5 V as to the reference potential VBIAS1, the NPN transistor 2603 enters the forward activation range again and begins to cause current to flow, and at the point that the voltage of the terminal 2604 drops around 0.7 V as to the reference potential VBIAS1, the NPN transistor 2603 turns on.

At the point that the NPN transistor 2603 turns on, the difference current between the input current and the drain current iD1(t) of the P-MOS transistor 2601, i.e., iin(t)−iD1(t), flows from the node 2605 via the NPN transistor 2603, and the voltage of the node 2605 drops so that the input current iin(t) and the drain current iD1(t) of the P-MOS transistor 2601 are equal.

Thus, output current iout(t) corresponding to the peak value of the input current iin(t) is obtained.

On the other hand, a current mode peak hold circuit co the configuration shown in FIG. 28 is known. The current mode peak hold circuit shown in FIG. 28 is an arrangement wherein conductor types of the components corresponding to those of the current mode peak hold circuit shown in FIG. 26 are reversed, and is configured of N-MOS transistors 2811 and 2812, a PNP transistor 2813, and an NPN transistor 2817.

The gates of the N-MOS transistors 2811 and 2812 are connected in common, the sources are grounded, the N-MOS transistor 2811 has the drain thereof connected to the terminal 2814, and the N-MOS transistor 2812 has the drain thereof connected to the terminal 2816. The collector of the PNP transistor 2813 is connected to the gates of the N-MOS transistor 2811 and 2812 connected in common, the emitter thereof is connected to the drain of the N-MOS transistor 2811, the base is connected to the reference potential VBIAS1. The emitter of the NPN transistor 2817 is connected to the drain of the N-MOS transistor 2811, the base is connected to the reference potential VBIAS2, and the collector thereof is connected to the electric power source VDD.

The reference potential VBIAS1 and the reference potential VBIAS2 are lower than the potential of the electric power source VDD but higher than the ground potential, are a potential such that the NPN transistor 2813 and the PNP transistor 2817 do not turn on simultaneously, and the difference potential between the reference potential VBIAS1 and the reference potential VBIAS1 is 0.7 V, for example.

In FIG. 28, V14(t) represents the absolute potential of the terminal 2814 at time t, iD11(t) represents the drain current of the N-MOS transistor 2811 at time t, iin(t) represents input current at time t, and iout(t) is output current at time t, with the direction of the arrows being the forward direction for each. Note that the output current iout(t) matches the drain current of the N-MOS transistor 2812.

(1) Let us say that the N-MOS transistor 2811 is operated at saturation range, and the drain current iD11(t) and input current iin(t) of the N-MOS transistor 2811 match, the potential of the terminal 2814 is generally the average potential of the two reference potentials VBIAS1 and VBIAS2, the voltage between the base and emitter of the PNP transistor 2813 and NPN transistor 2817 are both around 0.35 V, and both the PNP transistor 2813 and NPN transistor 2817 are in the cut-off state.

(2) In the event that the input current iin(t) increases over a period from time t0 to time t1 as shown in FIG. 29A for example, the relation between the drain current iD11(t) and input current iin(t) of the N-MOS transistor 2811 becomes that represented by iD11(t)<iin(t), so the voltage of the terminal 2814 rises. At this time, while the NPN transistor 2817 maintains the cut-off state, but at the point that the voltage of the terminal 2814 rises around 0.5 V as to the reference potential VBIAS1, the PNP transistor 2813 enters the forward activation range and begins to cause current to flow, and at the point that the voltage of the terminal 2814 rises around 0.7 V as to the reference potential VBIAS1, the PNP transistor 2813 turns on.

The current iin(t)−iD11(t) flows to the node 2815 via the PNP transistor 2813 so that iin(t) and iD11(t) match, and the voltage of the node 2815 rises.

The voltage of this node 2815 rises due to charge being supplied to the parasitic capacity between the gate sources of the N-MOS transistors 2811 and 2812 connected to the node 2815, via the PNP transistor 2813. At this time, the peak hold circuit shown in FIG. 28 acts as a current mirror circuit, and output current proportionate to the input current is obtained.

(3) In the event that the increase of iin(t) stops over a period from time t1 to time t2, iD11(t)=iin(t), and the voltage of the terminal 2814 drops so that both PNP transistor 2813 and NPN transistor 2817 reach cut-off, and settles down at around the average potential of the two reference potentials VBIAS1 and VBIAS2. At this time, the node 2815 is in a high-impedance state, so the charge at time t1 does not change, and the voltage between the gate sources of the M-MOS transistors 2811 and 2812 is maintained at VGS(t1). Here, the output current iout(t) is maintained at a current proportionate to the input current iin(t1) at time t1.

(4) In the event that the input current iin(t) at time t is smaller than the input current iin(t1) in a period from time t2 to time t3, voltage of the terminal 2814 further drops, but the PNP transistor 2813 maintains the cut-off state, so VGS(t1) is maintained, and output current iout(t) maintains the value at time t1. At this time, in the event that the voltage of the terminal 2814 drops around 0.7 V as to the reference potential VBIAS2, the NPN transistor 2817 enters the forward activation range and turns on, and a current of iD(t)−iin(t), i.e., iin(t1)−iin(t), flows.

(5) In the event that current exceeding the input current iin(t1) at time t1 is input in a period from time t3 to time t4, and the current continues to increase, the voltage of the terminal 2814 rises, and at the point that the voltage of the terminal 2814 rises around 0.5 V as to the reference potential VBIAS1, the PNP transistor 2813 enters the forward activation range again and begins to cause current to flow, and at the point that the voltage of the terminal 2814 rises around 0.7 V the PNP transistor 2813 turns on.

Then, the current iin(t)−iD11(t) flows to the node 2815 via the PNP transistor 2813, and the voltage of the node 2815 rises so that iin(t) and iD11(t) are equal. Thus, output voltage iout(t) corresponding to the input current iin(t) is obtained. Accordingly, output current corresponding to the peak value of the input current is obtained at the output terminal 2816.

However, in the event that operating the peak hold circuit shown in FIG. 26 with little change in magnitude at higher speeds is attempted, the following problems have occurred.

As described above, the voltage V4(t) of the terminal 2604 repeats rising and dropping according to the input current, and under the above-described bias conditions, the change in voltage thereof is around 0.7 V, as shown in FIG. 30.

On the other hand, there is parasitic capacity at the terminal 2604 such as junction capacitance of the connected devices, so charging and discharging to this parasitic capacity must be performed in order for the terminal 2604 to perform the above-described voltage change, and the charge for charging and discharging is supplied by the difference current between the input current iin(t) and the held current, i.e., with the drain current iD11(t) of the N-MOS transistor 2601.

Accordingly, in the event that the magnitude of change of the input current is small and the speed is high, sufficient charge necessary for voltage fluctuations is not supplied to the parasitic capacity of the terminal 2604, and the peak holding action does not work.

On the other hand, when attempting to operate the peak hold circuit shown in FIG. 28 with a small magnitude of change of the input current at higher speeds, the following problems have resulted.

As described above, the voltage V14(t) of the terminal 2814 repeats rising and dropping according to the input current, and under the above-described bias conditions, the fluctuation in voltage thereof is around 0.7 V, as shown in FIG. 31.

On the other hand, there is parasitic capacity added at the terminal 2814 such as junction capacitance of the connected devices, so charging and discharging to this parasitic capacity must be performed in order for the terminal 2814 to perform the above-described voltage fluctuations, and the charge for charging and discharging is supplied by the difference current between the input current iin(t) and the held current, i.e., with the drain current iD11(t) of the N-MOS transistor 2811.

Accordingly, in the event that the magnitude of change of the input current is small and the speed is high, sufficient charge necessary for voltage fluctuation is not supplied to the parasitic capacity of the terminal 2814, and the peak holding action does not work.

SUMMARY OF THE INVENTION

Accordingly, it is an object of the present invention to solve the above-described problems, and to provide a current mode peak hold circuit wherein output current corresponding to the peak value of input current can be obtained even for input currents with little change in magnitude, at essentially higher speeds.

The peak hold circuit according to a first aspect of the present invention comprises: a current mirror circuit for generating a first constant-current source for causing flow of a current that is the same magnitude as an input current from an input terminal, and a second constant-current source for causing flow of a current that is the input current multiplied by a predetermined multiplication factor; a first FET wherein the drain thereof is connected to the first constant-current source and the source thereof is connected to a first electric power source; a second FET wherein the drain thereof is connected to an output terminal and the source thereof is connected to the first electric power source and the gate thereof is connected in common with the gate of the first FET; a two-stage serial circuit comprising first and second transistors having complementary properties, provided between the gates connected in common and a second electric power source which has lower voltage than the first electric power source, wherein the nodes of the first and second transistors are connected to the drain of the first FET; current detecting means for detecting the drain current of the first FET; and applied voltage control means which compare a current which is a drain current detected by the current detecting means multiplied by the predetermined multiplication factor, with a current which is the input current from the second constant-current source multiplied by the predetermined multiplication factor, and applies a first applied voltage which is lower than voltage of the first electric power source to the first transistor, and also applies to the second transistor a second applied voltage which is constantly lower than the first applied voltage by a predetermined voltage wherein the first and second transistors are not simultaneously turned on, wherein, in the event that the detected current detected by the current detecting means is greater than the drain current of the first FET, the first voltage is applied as the first applied voltage to the first transistor so as to turn the first transistor on, and the second voltage is applied as the second applied voltage to the second transistor so as to turn the second transistor off, and in the event that the detected current is smaller than the drain current, a third voltage lower by the first voltage by a predetermined voltage is applied as the first applied voltage to the first transistor so as to turn the first transistor off, and a fourth voltage lower by the second voltage by a predetermined voltage is applied as the second applied voltage to the second transistor so as to turn the second transistor on, and further in the event that the detected current is equal to the drain current, an averaged voltage of the first voltage and the third voltage is applied as the first applied voltage to the first transistor so as to turn the first transistor off, and an averaged voltage of the second voltage and the fourth voltage is applied as the second applied voltage to the second transistor so as to turn the second transistor off.

A capacitor for holding charge may be connected between the gates of the first and second FETs connected in common and the first electric power source. The peak hold circuit may also further comprise switching means for setting the potential of the gates of the first and second FETs connected in common to the potential of the first electric power source.

Also, the first and second FETs may be P-MOS FETs, the first transistor may be an NPN transistor, and the second transistor may be a PNP transistor. Or, the first and second FETs may be P-MOS FETs, the first transistor may be an N-MOS transistor, and the second transistor may be a P-MOS transistor.

The peak hold circuit according to a second aspect of the present invention comprises: a current mirror circuit for generating a first constant-current source for causing flow of a current that is the same magnitude as an input current to an input terminal, and a second constant-current source for causing flow of a current that is the input current multiplied by a predetermined multiplication factor; a first FET wherein the drain thereof is connected to the first constant-current source and the source thereof is connected to a second electric power source with lower voltage than a first electric power source; a second FET wherein the drain thereof is connected to an output terminal and the source thereof is connected to the second electric power source and the gate thereof is connected in common with the gate of the first FET; a two-stage serial circuit comprising first and second transistors having complementary properties, provided between the gates connected in common and the first electric power source, wherein the nodes of the first and second transistors are connected to the drain of the first FET; current detecting means for detecting the drain current of the first FET; and applied voltage control means which compare a current which is a drain current detected by the current detecting means multiplied by the predetermined multiplication factor, with a current which is the input current from the second constant-current source multiplied by the predetermined multiplication factor, and applies a first applied voltage which is higher than voltage of the second electric power source to the first transistor, and also applies to the second transistor a second applied voltage which is constantly higher than the first applied voltage by a predetermined voltage wherein the first and second transistors are not simultaneously turned on, wherein, in the event that the detected current detected by the current detecting means is greater than the drain current of the first FET, the first voltage is applied as the first applied voltage to the first transistor so as to turn the first transistor on, and the second voltage is applied as the second applied voltage to the second transistor so as to turn the second transistor off, and in the event that the detected current is smaller than the drain current, a third voltage higher than the first voltage by a predetermined voltage is applied as the first applied voltage to the first transistor so as to turn the first transistor off, and a fourth voltage higher than the second voltage by a predetermined voltage is applied as the second applied voltage to the second transistor so as to turn the second transistor on, and further in the event that the detected current is equal to the drain current, an averaged voltage of the first voltage and the third voltage is applied as the first applied voltage to the first transistor so as to turn the first transistor off, and an averaged voltage of the second voltage and the fourth voltage is applied as the second applied voltage to the second transistor so as to turn the second transistor off.

A capacitor for holding charge may be connected between the gates of the first and second FETs connected in common and the second electric power source. The peak hold circuit may further comprise switching means for setting the potential of the gates of the first and second FETs connected in common to the potential of the second electric power source.

Also, the first and second FETs may be N-MOS FETs, the first transistor may be a PNP transistor, and the second transistor may be an NPN transistor. Or, the first and second FETs may be N-MOS FETs, the first transistor may be a P-MOS FET, and the second transistor may be an N-MOS FET.

Further objects, features and advantages of the present invention will become apparent from the following description of the preferred embodiments with reference to the attached drawings.

DESCRIPTION OF THE PREFERRED EMBODIMENTS

First Embodiment

Figure 1:
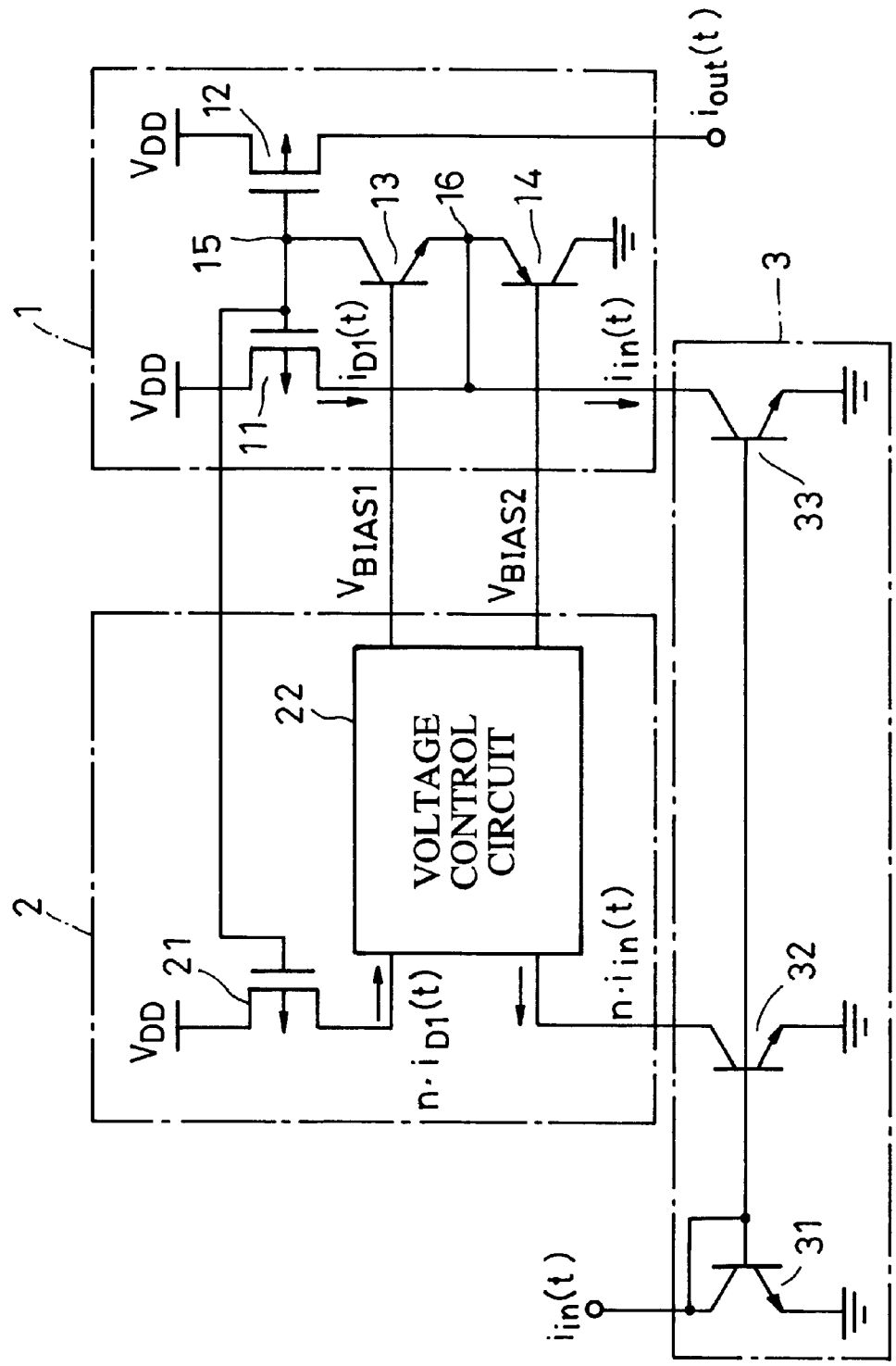
FIG. 1 is a circuit diagram illustrating a first embodiment of the present invention.

FIG. 1 illustrates a first embodiment of the present invention. The arrows in FIG. 1 indicate the forward direction of flow of the current. In FIG. 1, reference numeral 1 denotes a current control circuit, made up of P-MOS transistors 11 and 12, an NPN transistor 13, and a PNP transistor 14. The P-MOS transistors 11 and 12 have the gates thereof connected one to another, the sources connected to the electric power source VDD, and the drain of the P-MOS transistor 12 is connected to an output terminal. The NPN transistor 13 has the collector thereof connected to the gates of the P-MOS transistors 11 and 12 connected in common, the emitter thereof is connected to the drain of the P-MOS transistor 11, and the base thereof is connected to a voltage control circuit 22 (reference potential VBIAS1). The PNP transistor 14 has the emitter thereof connected to the emitter of the NPN transistor 13, the base thereof is connected to the voltage control circuit 22 (reference potential VBIAS2), and the collector thereof is grounded.

Reference numeral 2 denotes a voltage control unit, for controlling the two reference potentials VBIAS1 and VBIAS2 according to the difference between the input current iin(t) and the drain current iD(t) of the P-MOS transistor 11, and is configured of a P-MOS transistor 21 and the voltage control circuit 22. The P-MOS transistor 21 is for detecting the drain current iD(t) of the P-MOS transistor 11, with the gate thereof connected to the gates of the P-MOS transistors 11 and 12 of the current control circuit 1 connected in common, the source thereof is connected to the electrical power source VDD, and the drain thereof is connected to the voltage control circuit 22.

Now, the ratio in size between the P-MOS transistor 11 and the P-MOS transistor 21, i.e., the W/L ratio wherein W represents the gate width of the P-MOS transistor and L represents the gate length, is set at 1:n, and the drain current of the P-MOS transistor 21 is n·iD(t).

In the event that n·iD(t)>n·iin(t) holds, the voltage control circuit 22 lowers the two reference potentials VBIAS1 and VBIAS2 while maintaining the difference voltage thereof, while in the event that n·iD(t)<n·iin(t) holds, the voltage control circuit 22 raises the two reference potentials VBIAS1 and VBIAS2 while maintaining the difference voltage thereof.

Reference numeral 3 denotes a current mirror circuit, configured of NPN transistors 31, 32, and 33. The NPN transistors 31, 32, and 33 have the bases thereof connected in common. The NPN transistor 31 has the collector thereof connected to the input terminal and the base, and the emitter thereof connected to a ground. The NPN transistor 32 has the collector thereof connected to the voltage control circuit 22 of the voltage control unit 2, and the emitter thereof connected to a ground. The NPN transistor 33 has the collector thereof connected to the drain of the P-MOS transistor 11 of the current control circuit 1, and the emitter thereof is grounded.

Accordingly, an inversion terminal of a current input comparator 223 of the voltage control circuit 22 connected to the collector of the NPN transistor 32 receives input of current (n·iin(t)) proportionate to the input current iin(t) input to the collector of the NPN transistor 31 via the input terminal.

Figure 2:
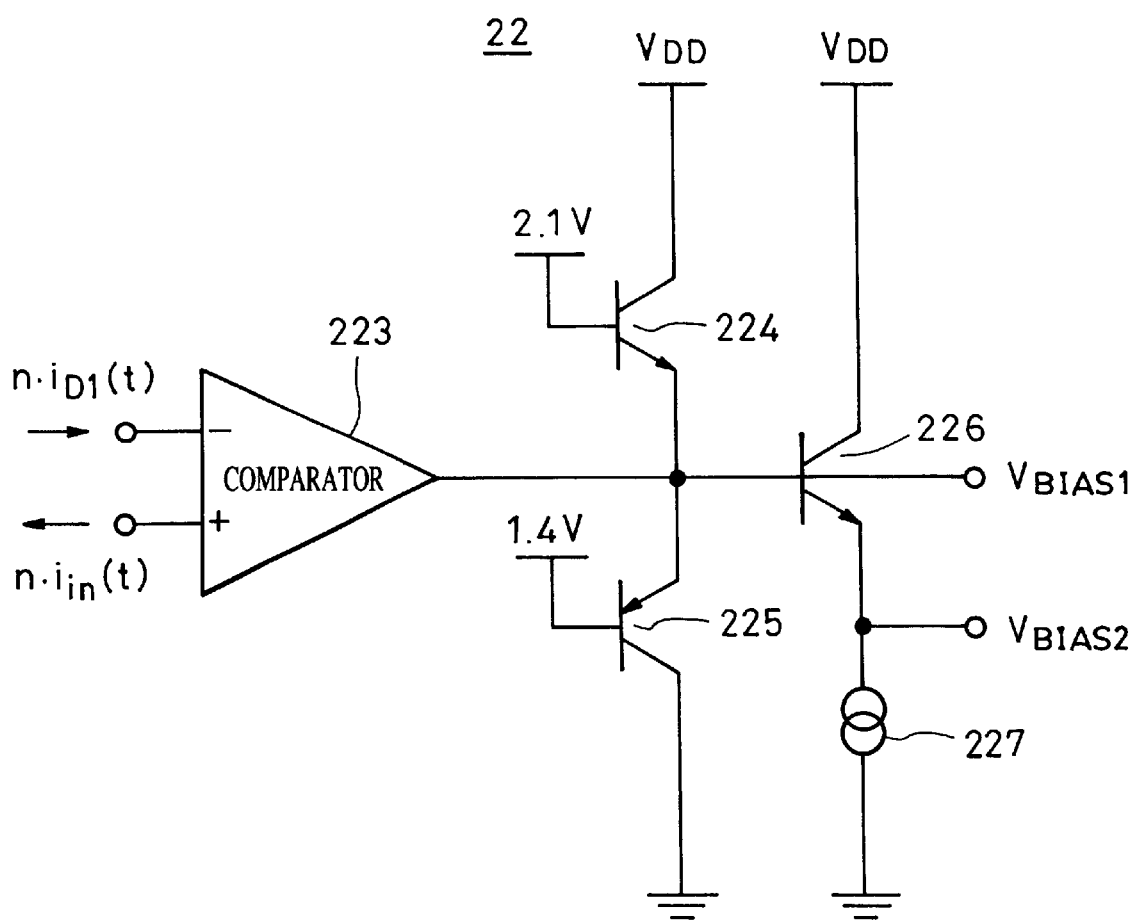
FIG. 2 is a circuit diagram illustrating the configuration of the voltage control circuit shown in FIG. 1.

FIG. 2 illustrates the configuration of the voltage control circuit 22 shown in FIG. 1. The voltage control circuit 22 is made up of a comparator 223, NPN transistors 224 and 226, a PNP transistor 225, and a constant-current source 227.

The comparator 223 is a current-input/voltage-output comparator, with the non-inverted terminal connected to the drain of the P-MOS transistor 21 of the voltage control unit 2, and the inversion terminal connected to the collector of the NPN transistor 32 of the current mirror circuit 3. The input current indicated by the direction of the arrows at the two input terminals of the comparator 223 are the forward direction thereof. In the event that n·iD(t)<n·iin(t) holds, the comparator 23 attempts to output high-level potential generally equal to VDD, and in the event that n·iD(t)>n·iin(t) holds, the comparator 23 attempts to output low-level potential generally equal to ground potential.

The NPN transistor 224 is provided for restricting the low-level output potential of the comparator 223, with the collector thereof connected to the electric power source VDD (voltage higher than 2.1 V power source), the base thereof is connected to the 2.1 V power source, and the emitter is connected to the output terminal of the comparator 223. The voltage between the base and emitter of the NPN transistor 224 when on is approximately 0.7 V, so the low-level output potential of the comparator 223 is restricted to a potential approximately 0.7 V lower than the potential of the 2.1 V power source, and is approximately 1.4 V.

The PNP transistor 225 is provided for restricting the high-level output potential of the comparator 223, with the emitter thereof connected to the emitter of the NPN transistor 224, the base thereof is connected to the 1.4 V power source, and the collector thereof is grounded. The voltage between the base and emitter of the PNP transistor 225 when on is approximately 0.7 V, so the high-level output potential of the comparator 223 is restricted to a potential approximately 0.7 V higher than the potential of the 1.4 V power source, and is approximately 2.1 V.

The NPN transistor 226 and constant-current source 227 make up an emitter-following circuit, with the collector of the NPN transistor 226 connected to the electric power source VDD, the base thereof is connected to the output terminal of the comparator 223 (reference potential VBIAS1) and the base of the NPN transistor 13 of the current control circuit 1, and the emitter thereof is connected to the constant-current source 227 and the base of the NPN transistor 14 of the current control circuit 1. The potential of the output terminal of the emitter-follower circuit, i.e., the potential of the emitter of the NPN transistor 226 (reference potential VBIAS2) is lower than the reference potential VBIAS1 by approximately 0.7 V.

Accordingly, the range of voltage change of the reference potential VBIAS1 is from 1.4 V to 2.1 V, the range of voltage change of the reference potential VBIAS2 is from 0.7 V to 1.4 V, and VBIAS1−VBIAS2=0.7 V.

Next, the operation will be described with reference to FIGS. 3A and 3B. Now, in the event that n·iD(t)=n·iin(t) holds, the reference potential VBIAS1 and the reference potential VBIAS2 are both at the average potential of the voltage change range, i.e., 1.75 V (=1.4+2.1)/2) and 1.05 V (=(0.7+1.4)/2).

First, the P-MOS transistor 11 is operated at saturation range, and the drain current iD(t) of the P-MOS transistor 11 and collector current iin(t) of the NPN transistor 33 match. In this state, n·iD(t)=n·iin(t) holds, the reference potential VBIAS1 and the reference potential VBIAS2 are at within the average potential of the voltage fluctuation range, at 1.75 V and 1.05 V respectively. At this time, the potential of the node 16 is generally 1.4 V which is the average potential of the reference potential VBIAS1 and the reference potential VBIAS2. Also, the voltage between the base and emitter of the NPN transistor 13 and PNP transistor 14 are both around 0.35 V, and are in the cut-off state.

Figure 3A:
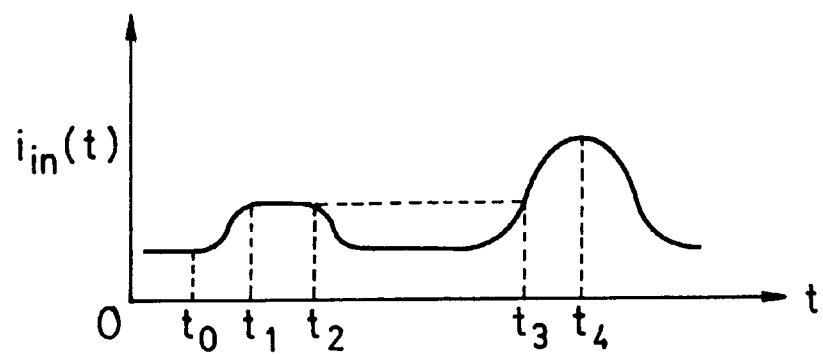
FIGS. 3A and 3B are explanatory diagrams for describing the operating of the peak hold circuit shown in FIG. 1.
Figure 3B:
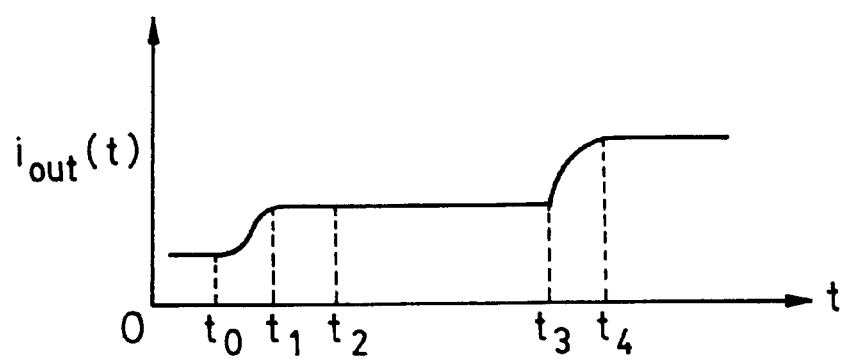

(1) In the event that the input current iin(t) increases over a period from time t0 to time t1 as shown in FIG. 3A for example, i.e., in the event that iD(t)<iin(t) holds, the voltage of the node 16 drops as to the two reference potentials VBIAS1 and VBIAS2. At this time, the PNP transistor 14 maintains the cut-off state, but at the point that the voltage of the node 16 drops around 0.5 V as to the reference potential VBIAS1, the NPN transistor 13 enters the forward activation range and begins to cause current to flow, and at the point that the voltage drops around 0.7 V, the NPN transistor 13 turns on.

Then, current equivalent to iin(t)−iD(t) flows from the node 15 via the NPN transistor 13, and the voltage of the node 15 drops so that the collector current iin(t) and the drain current iD1(t) are equal. The potential drop of this node 15 drops by charge being extracted from the parasitic capacity between the gate sources of the P-MOS transistors 11 and 12 connected to the node 15, via the NPN transistor 13. At this time, the current mode current control circuit 1 acts as a current mirror circuit, and output current proportionate to the input current is obtained.

Now, taking note of the change in the absolute potential of the node 16, as described above, in the event that iD(t)<iin(t) holds the voltage of the node 16 drops as to the two reference potentials VBIAS1 and VBIAS2. Also, n·iD (t)<n·iin(t) holds, so the reference potential VBIAS1 and reference potential VBIAS2 rise, and in the event that the NPN transistor 13 is on, the reference potential VBIAS1 reaches 2.1 V, and the absolute potential of the node 16 is 1.4 V.

Figure 4:
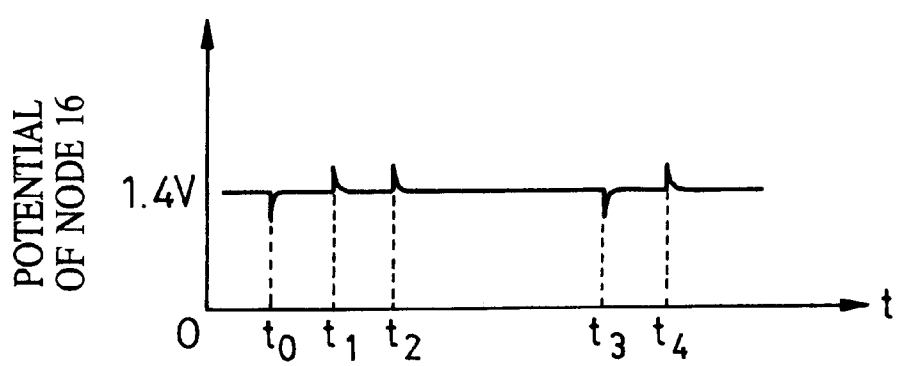
FIG. 4 is a diagram illustrating an example of change in the potential at the node 16 shown in FIG. 1.

As can be understood from FIG. 4 illustrating the potential of the node 16, the fluctuation in potential of the node 16 can be kept lower than conventional examples wherein the reference potential VBIAS1 and reference potential VBIAS2 have fixed potential.

(2) In the event that the increase of iin(t) stops, such as over a period from time t1 to time t2, iD(t)=iin(t) holds, the voltage of the node 16 rises as to the two reference potentials VBIAS1 and VBIAS2 so that the NPN transistor 13 and the PNP transistor 14 reach cut-off, and settles down at around the average potential of the reference potentials VBIAS1 and VBIAS2. At this time, the node 15 is in a high-impedance state, so the charge at time t1 does not change, and the voltage between the gate sources of the P-MOS transistors 11 and 12 is maintained at VGS(t1). Accordingly, the output current iout(t) is maintained at a current proportionate to the input current iin(t1) at time t1.

Now, taking note of the change in the absolute potential of the node 16, as described above, when iD(t)=iin(t) holds the voltage of the node 16 rises as to the two reference potentials VBIAS1 and VBIAS2, and settles down at around the average potential thereof. However, n·iD(t)=n·iin(t) holds, so the reference potential VBIAS1 and reference potential VBIAS2 drop, to 1.75 V and 1.05 V respectively. Accordingly, the absolute potential of the node 16 is generally 1.4 V which is the average potential thereof.

As can be understood from FIG. 4, the fluctuation in potential of the node 16 can be kept lower than conventional examples wherein the reference potential VBIAS1 and reference potential VBIAS2 have fixed potential.

(3) In the event that iin(t) is smaller than iin(t1), such as in a period from time t2 to time t3, voltage of the node 16 further rises, as to the two reference potentials VBIAS1 and VBIAS2. However, the NPN transistor 13 maintains the cut-off state, so VGS(t1) is maintained, and the value of the output current iout(t) at time t1 is maintained.

Now, at the point that the voltage of the node 16 rises around 0.7 V as to the reference potential VBIAS2, the PNP transistor 14 enters the forward activation range and turns on, and the current of iD(t)−iin(t), i.e., iin(t1) 10 iin(t), flows.

Taking note of the change in the absolute potential of the node 16 at this time, as described above, the voltage of the node 16 further rises as to the two reference potentials VBIAS1 and VBIAS2. At this time, n·iD(t)>n·iin(t) holds, so the reference potential VBIAS1 and reference potential VBIAS2 drop further, and in the event that the PNP transistor 14 is on the reference potential VBIAS2 reaches 0.7 V. Accordingly, the absolute potential of the node 16 is approximately 1.4 V.

As can be understood from FIG. 4, the fluctuation in potential of the node 16 can be kept lower than conventional examples wherein the reference potential VBIAS1 and reference potential VBIAS2 have fixed potential.

(4) In the event that current exceeding iin(t1) is input such as in a period from time t3 to time t4 and continues to increase, the voltage of the node 16 drops as to the two reference potentials VBIAS1 and VBIAS2, and at the point that the voltage drops around 0.5 V as to the reference potential VBIAS1, the NPN transistor 13 enters the forward activation range again and begins to cause current to flow, the voltage drops to around 0.7 V and NPN transistor 13 turns on. Then, a current equivalent to iin(t)−iD(t) flows from the node 15 via the NPN transistor 13, and the voltage of the node 15 drops so that the collector current iin(t) of the NPN transistor 33 and the drain current iD(t) of the P-MOS transistor are equal.

Thus, output current iout(t) corresponding to the input current iin(t) is obtained.

Taking note of the change in the absolute potential of the node 16 at this time, as described above, the voltage of the node 16 drops as to the two reference potentials VBIAS1 and VBIAS2, but n·iD11(t)<n·iin(t) holds at this time, so the reference potential VBIAS1 and reference potential VBIAS2 rise, and in the event that the NPN transistor 13 is on, the potential of the reference potential VBIAS1 reaches 2.1 V. Accordingly, the potential of the node 16 is approximately 1.4 V.

As can be understood from FIG. 4, the fluctuation in potential of the node 16 can be kept lower than conventional examples wherein the reference potential VBIAS1 and reference potential VBIAS2 have fixed potential.

Thus, output current according to the peak value of the input current is obtained.

According to the present embodiment, the fluctuation in absolute potential of the reference potential of the node 16 is far less than conventional examples wherein the reference potential VBIAS1 and reference potential VBIAS2 have fixed potential, and further, output current according to the peak value of the input current can be obtained for input currents with little change in magnitude at higher speeds.

Second Embodiment

Figure 5:
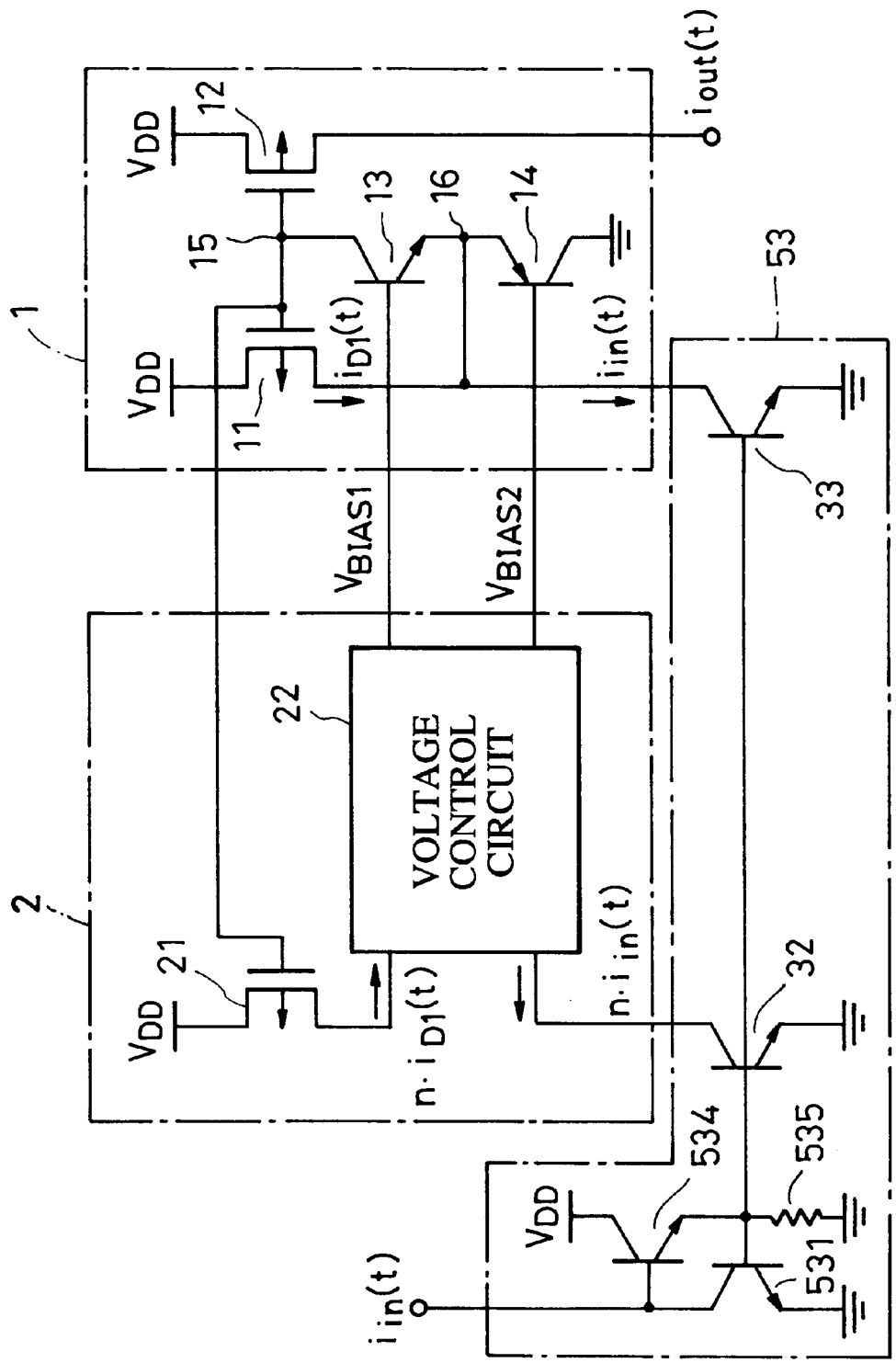
FIG. 5 is a circuit diagram illustrating a second embodiment of the present invention.

FIG. 5 illustrates a second embodiment of the present invention. The present embodiment differs from the first embodiment in that the configuration of the current mirror circuit differs.

That is, with the first embodiment, the current mirror circuit 3 is configured of NPN transistors 31, 32, and 33, so as to generate three constant-current sources.

Conversely, with the present embodiment, the current mirror circuit 53 comprises an NPN transistor 531 with the collector thereof connected to the input terminal, an NPN transistor 534, a resistor 5353, and an NPN transistor 32, thus making up a three-transistor current mirror circuit, and an NPN transistor 33, so as to generate two constant-current sources.

Third Embodiment

Figure 6:
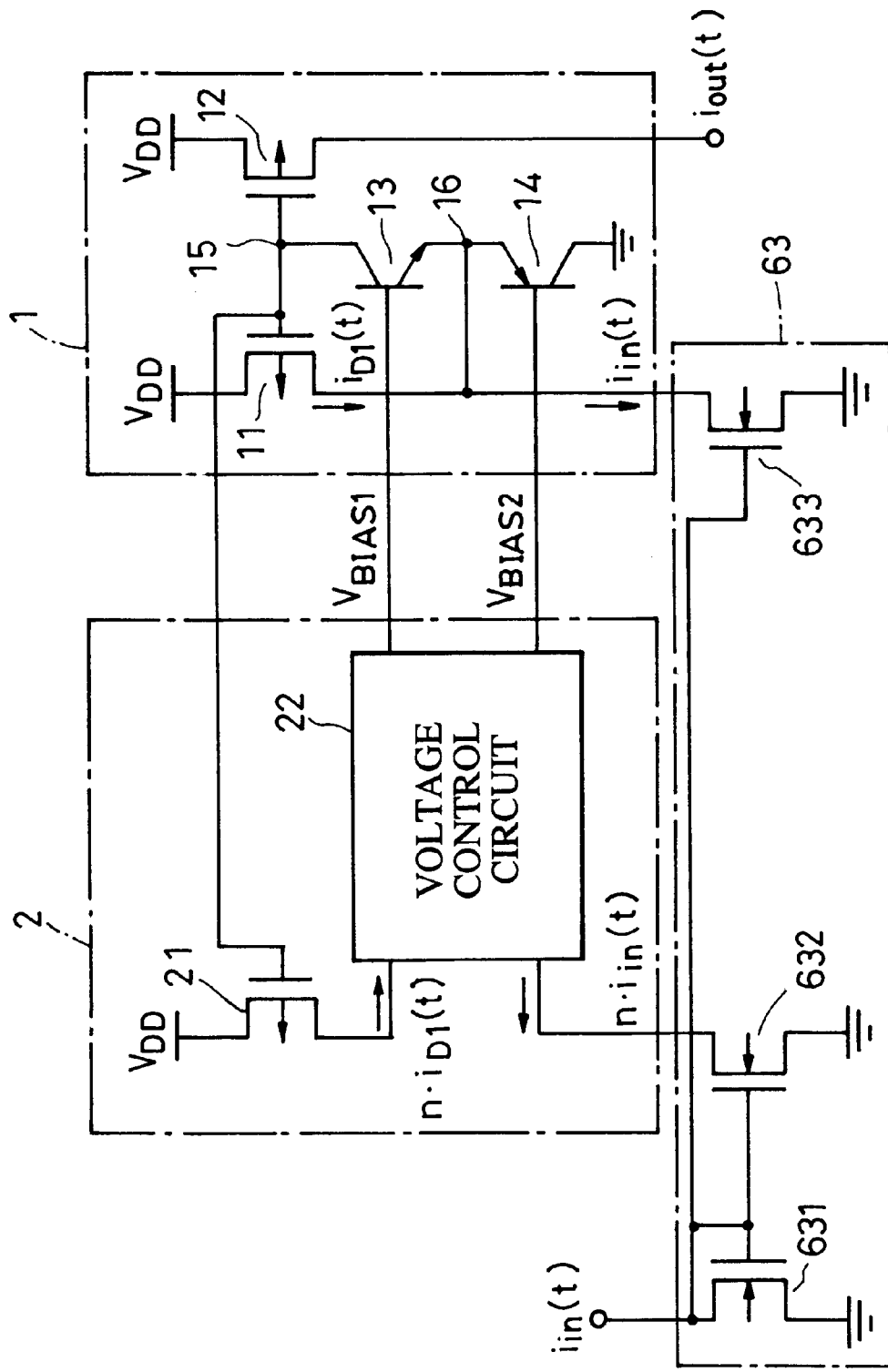
FIG. 6 is a circuit diagram illustrating a third embodiment of the present invention.

FIG. 6 illustrates a third embodiment of the present invention. The present embodiment differs from the first embodiment in that the configuration of the current mirror circuit differs. That is, with the first embodiment, the current mirror circuit 3 is configured of NPN transistors 31, 32, and 33, so as to generate two constant-current sources.

Conversely, with the present embodiment, the current mirror circuit 63 substitutes N-MOS transistors 631, 632, and 633 for the NPN transistors 31, 32, and 33 in the current mirror circuit 3 of the first embodiment, shown in FIG. 1.

Fourth Embodiment

Figure 7:
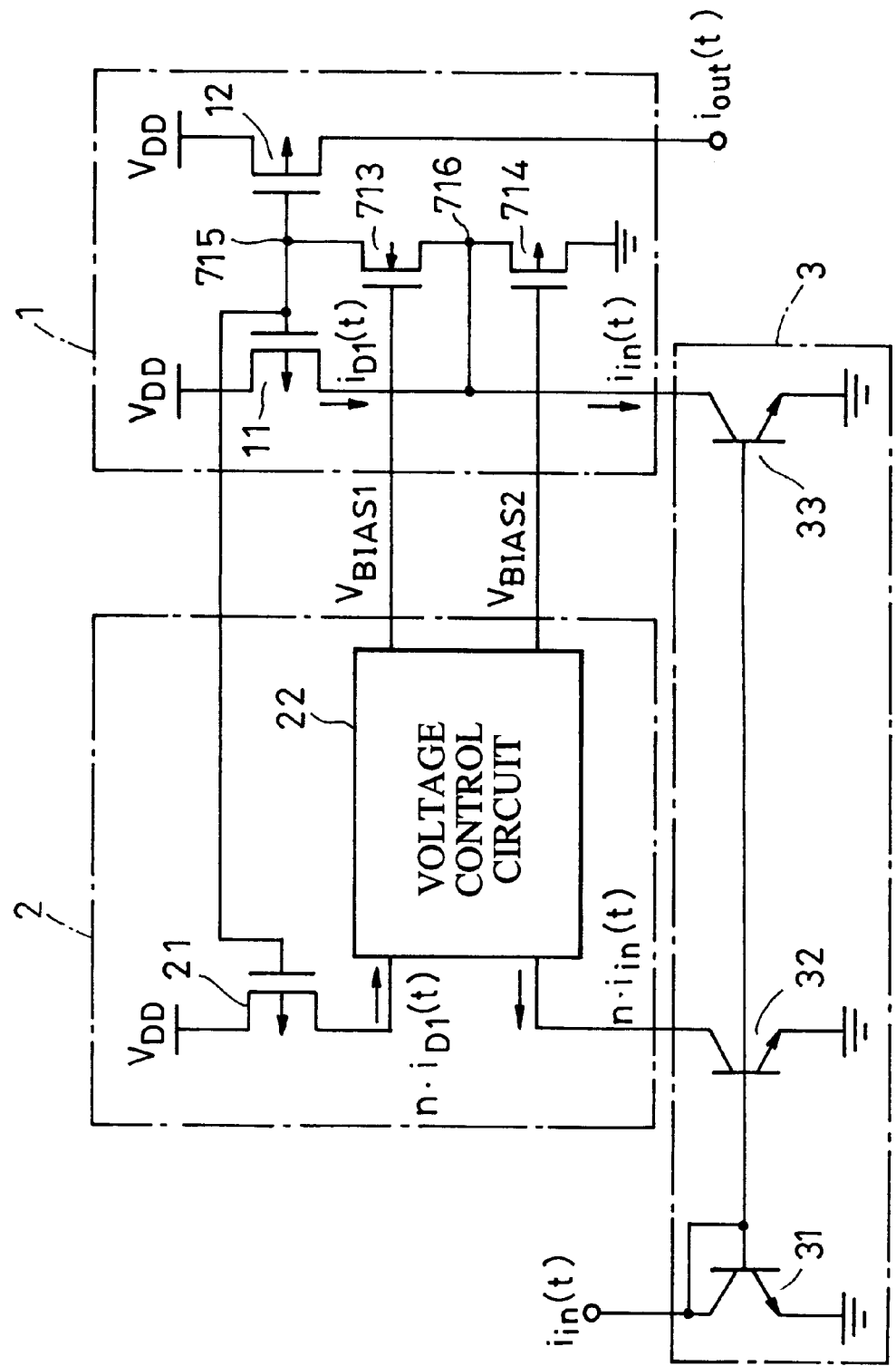
FIG. 7 is a circuit diagram illustrating a fourth embodiment of the present invention.

FIG. 7 illustrates a fourth embodiment of the present invention. The present embodiment differs from the first embodiment in that the configuration of the current control circuit differs.

That is, with the current control circuit 71 according to the present embodiment, the NPN transistor 13 and PNP transistor 14 of the current control circuit 7 according to the first embodiment shown in FIG. 1 is substituted with an N-MOS transistor 713 and P-MOS transistor 714.

Accordingly, in the event that the potential at the node 716 drops in comparison to the reference potential VBIAS1 by the threshold potential of the N-MOS transistor 713 or more, the N-MOS transistor 713 turns on, while in the event that the potential at the node 716 rises in comparison to the reference potential VBIAS2 by the threshold potential of the P-MOS transistor 714 or more, the P-MOS transistor 714 turns on.

Figure 8:
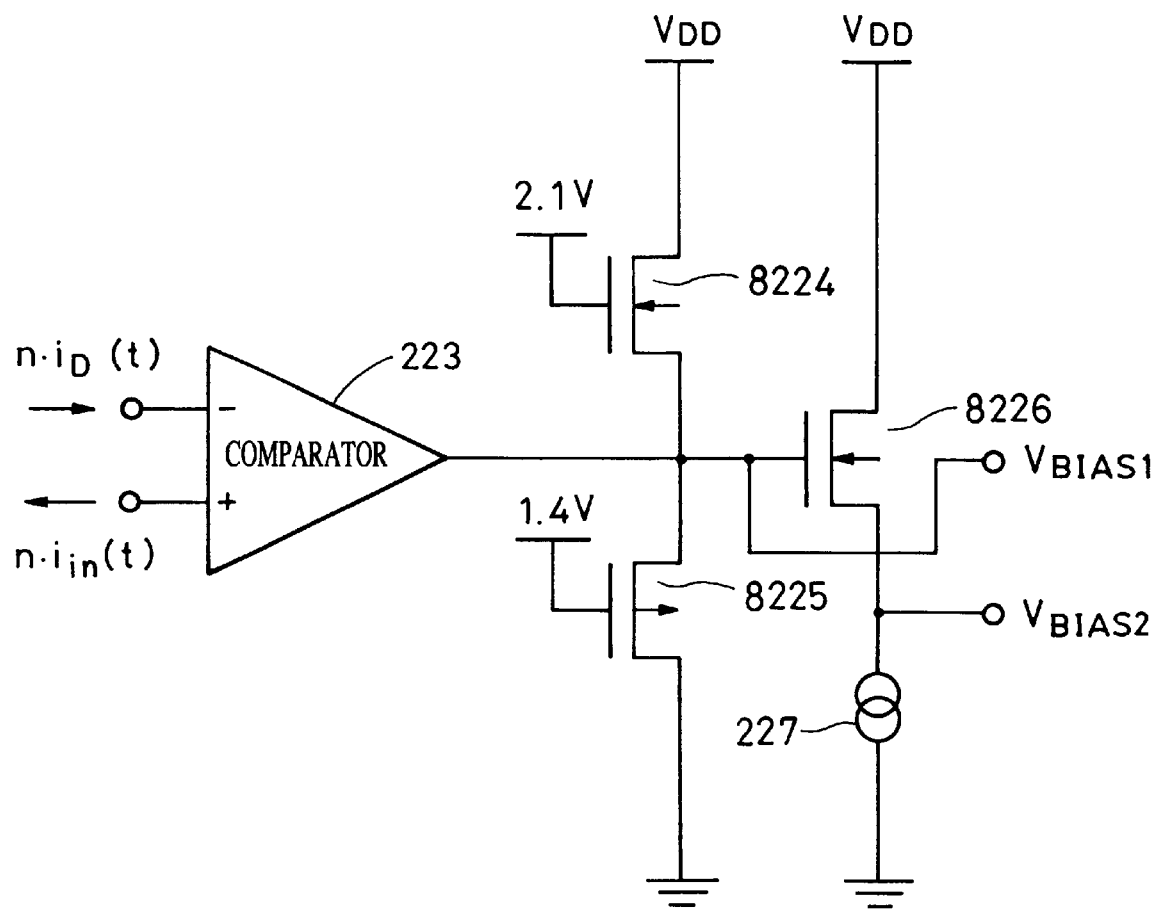
FIG. 8 is a circuit diagram illustrating the configuration of a voltage control circuit substitutable with the voltage control circuit 22 shown in FIG. 7.

The voltage control circuit 22 according to the present embodiment may be substituted with a voltage control circuit of a configuration shown in FIG. 8. This voltage control circuit has the NPN transistor 244, PNP transistor 225, and NPN transistor 226 of the voltage control circuit 22 shown in FIG. 2 substituted with an N-MOS transistor 8224, a P-MOS transistor 8225, and a N-MOS transistor 8226, respectively.

Further note that the current mirror circuit 3 according to the present embodiment may be substituted with either current mirror circuit 53 or 63, shown in FIGS. 5 and 6, according to the second and third embodiments.

Fifth Embodiment

Figure 9:
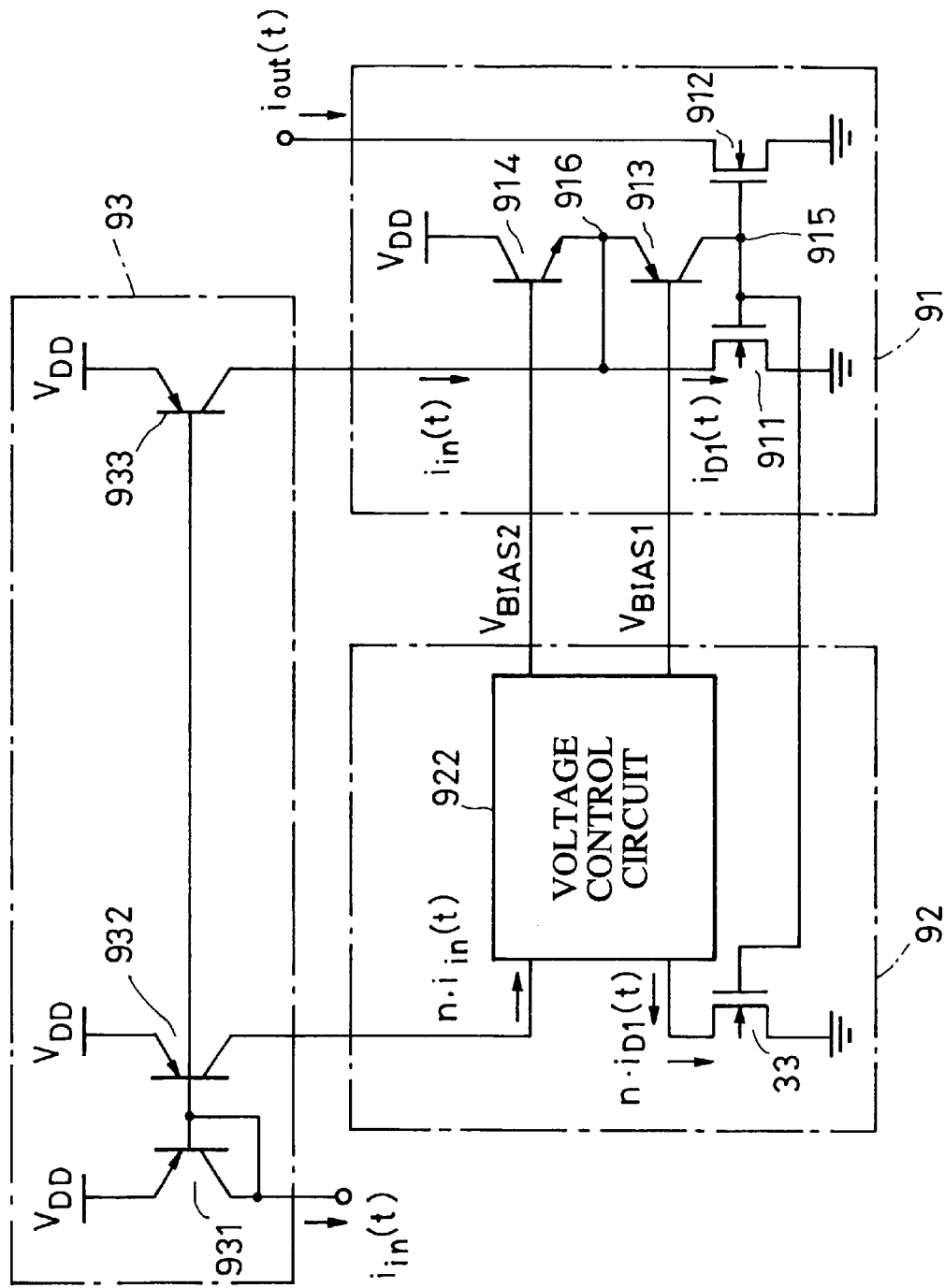
FIG. 9 is a circuit diagram illustrating a fifth embodiment of the present invention.

FIG. 9 illustrates a fifth embodiment of the present invention. The present embodiment differs from the first embodiment in that the configuration of the peak hold circuit differs.

FIG. 9 will now be described. The arrows in FIG. 9 indicate the forward direction of flow of the current. In FIG. 9, reference numeral 91 denotes a current control circuit, made up of N-MOS transistors 911 and 912, a PNP transistor 913, and a PNP transistor 914. The N-MOS transistors 911 and 912 have the gates thereof connected one to another, the sources grounded, and the drain of the N-MOS transistor 912 is connected to an output terminal.

The PNP transistor 913 has the collector thereof connected to the gates of the N-MOS transistors 911 and 912 connected in common, the emitter thereof connected to the drain of the N-MOS transistor 911, and the base thereof connected to the reference potential VBIAS1 of a voltage control circuit 922. The NPN transistor 914 has the emitter thereof connected to the emitter of the PNP transistor 913, the base thereof is connected to the reference potential VBIAS2 of the voltage control circuit 922, and the collector thereof is connected to the electric power source VDD.

Reference numeral 92 denotes a voltage control unit, for controlling the two reference potentials VBIAS1 and VBIAS2 according to the difference between the input current iin(t) and the drain current iD(t) of the N-MOS transistor 911, and is configured of an N-MOS transistor 921 and the voltage control circuit 922. The N-MOS transistor 921 is for detecting the drain current iD(t) of the N-MOS transistor 911, with the gate thereof connected to the gates of the N-MOS transistors 911 and 912 of the current control circuit 91 connected in common, the source thereof is grounded, and the drain thereof is connected to the voltage control circuit 22.

Now, the ratio in size between the N-MOS transistor 911 and the N-MOS transistor 921, i.e., the W/L ratio wherein W represents the gate width of the N-MOS transistor and L represents the gate length, is set at 1:n, and the drain current of the N-MOS transistor 921 is n·iD(t).

In the event that n·iD(t)>n·iin(t) holds, the voltage control circuit 922 raises the two reference potentials VBIAS1 and VBIAS2 while maintaining the difference potential thereof, while in the event that n·iD(t)<n·iin(t) holds, the voltage control circuit 922 lowers the two reference potentials VBIAS1 and VBIAS2 while maintaining the difference potential thereof.

Reference numeral 93 denotes a current mirror circuit, configured of PNP transistors 931, 932, and 933. The PNP transistors 931, 932, and 933 have the bases thereof connected in common. The PNP transistor 931 has the collector thereof connected to the input terminal and the base, and the emitter thereof connected to the electric power source VDD. The PNP transistor 932 has the collector thereof connected to the voltage control circuit 922 of the voltage control unit 92, and the emitter thereof connected to a ground. The PNP transistor 933 has the collector thereof connected to the drain of the N-MOS transistor 911 of the current control circuit 91, and the emitter thereof is connected to the electric power source VDD.

Accordingly, the inversion terminal (FIG. 10) of a comparator 223 of the voltage control circuit 922 connected to the collector of the PNP transistor 932 receives input of current (n·iin(t)) proportionate to the input current iin(t) input to the collector of the PNP transistor 931 via the input terminal.

Figure 10:
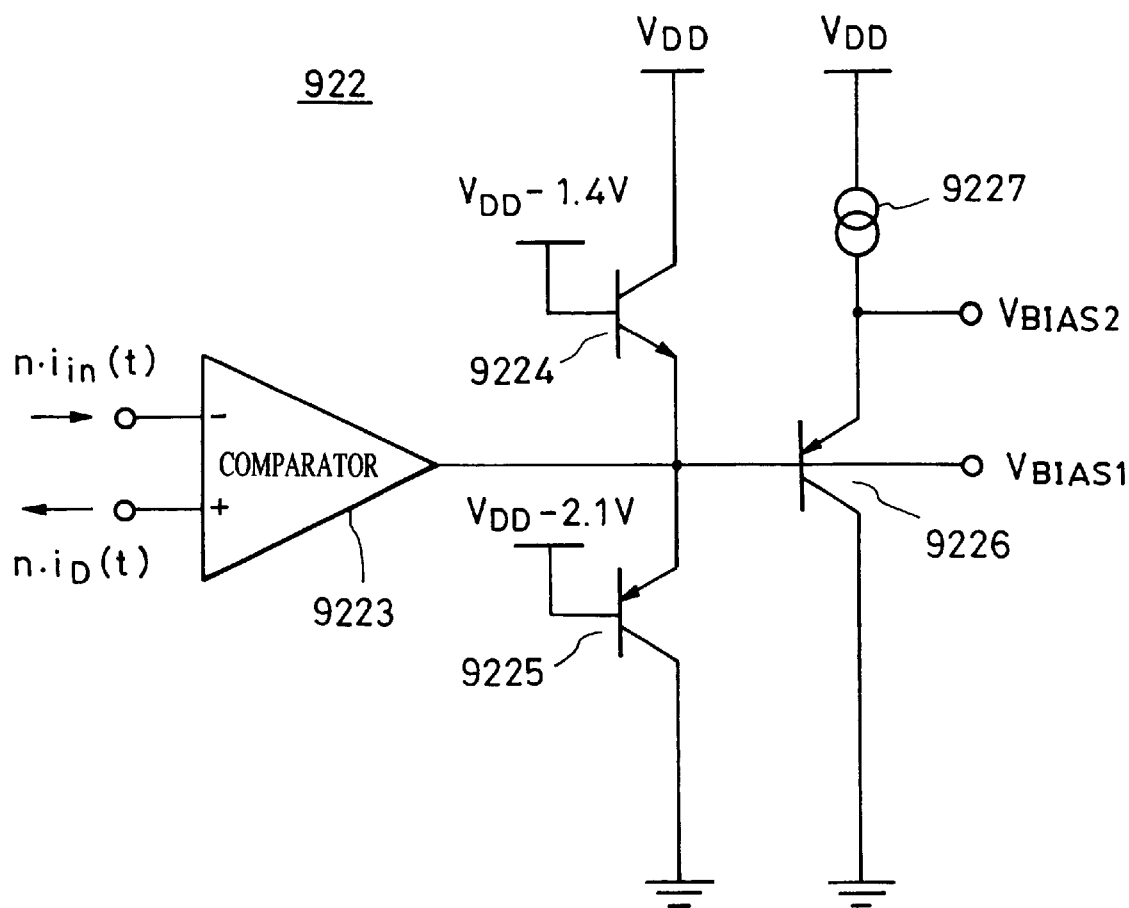
FIG. 10 is a circuit diagram illustrating the configuration of the voltage control circuit 922 shown in FIG. 9.

FIG. 10 illustrates the configuration of the voltage control circuit 922 shown in FIG. 9. The voltage control circuit 922 is made up of a comparator 9223, PNP transistors 9225 and 9226, an NPN transistor 9224, and a constant-current source 9227.

The comparator 9223 is a current-input/voltage-output comparator, with the non-inverted terminal connected to the drain of the N-MOS transistor 921 of the voltage control unit 92, and the inversion terminal connected to the collector of the PNP transistor 932 of the current mirror circuit 93. The input current indicated by the direction of the arrows at the two input terminals of the comparator 9223 are the forward direction thereof. In the event that n·iD(t)>n·iin(t) holds, the comparator 9223 attempts to output high-level potential generally equal to VDD, and in the event that n·iD(t)<n·iin(t) holds, the comparator 9223 attempts to output low-level potential generally equal to ground potential.

The NPN transistor 9224 is provided for restricting the low-level output potential of the comparator 9223, with the collector thereof connected to the electric power source VDD, the base thereof is connected to the (VDD−1.4 V) power source, and the emitter is connected to the output terminal of the comparator 9223. The voltage between the base and emitter of the NPN transistor 9224 when on is approximately 0.7 V, so the low-level output potential of the comparator 9223 is restricted to a potential approximately 0.7 V lower than the potential of the (VDD−1.4 V) power source, and is approximately (VDD−2.1 V).

The PNP transistor 9225 is provided for restricting the high-level output potential of the comparator 9223, with the emitter thereof connected to the emitter of the NPN transistor 9224, the base thereof is connected to the (VDD−2.1 V) power source, and the collector thereof is grounded. The voltage between the base and emitter of the PNP transistor 9225 when on is approximately 0.7 V, so the high-level output potential of the comparator 9223 is restricted to a potential approximately 0.7 V higher than the potential of the (VDD−2.1 V) power source, and is approximately (VDD−1.4 V).

The PNP transistor 9226 and constant-current source 9227 make up an emitter-following circuit, with the collector of the PNP transistors 9226 connected to a ground, the base thereof is connected to the output terminal of the comparator 9223 (reference potential VBIAS1) and the base of the PNP transistor 913 of the current control circuit 91, and the emitter thereof is connected to the constant-current source 9227 and the base of the NPN transistor 914 of the current control circuit 91. The potential of the output terminal of the emitter-follower circuit, i.e., the potential of the emitter of the PNP transistor 9226 (reference potential VBIAS2) is higher than the reference potential VBIAS1 by approximately 0.7 V.

Accordingly, the range of voltage change of the reference potential VBIAS1 is from (VDD−2.1 V) to (VDD−1.4 V), the range of voltage change of the reference potential VBIAS2 is from (VDD−1.4 V) to (VDD−0.7 V), and VBIAS1−VBIAS2=0.7 V.

Next, the operation will be described with reference to FIGS. 11A and 11B. Now, in the event that n·iD(t)=n·iin(t) holds, the reference potential VBIAS1 and the reference potential VBIAS2 are both at the average potential of the voltage change range.

First, the N-MOS transistor 911 is operated at saturation range, and the drain current iD1(t) of the N-MOS transistor 911 and collector current iin(t) of the PNP transistor 933 match. Accordingly, in this state, n·iD(t)=n·iin(t) holds, and the reference potential VBIAS1 and the reference potential VBIAS2 are within the voltage fluctuation range, at (VDD−1.75 V) and (VDD−1.05 V), respectively. At this time, the potential of the node 16 is generally (VDD−1.4 V) which is the average potential of the reference potential VBIAS1 and the reference potential VBIAS2. Also, the voltage between the base and emitter of the PNP transistor 913 and NPN transistor 914 are both around 0.35 V, and are in the cut-off state.

Figure 11A:
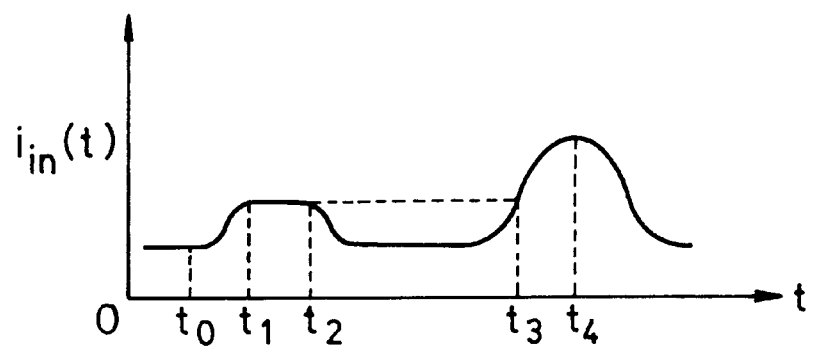
FIGS. 11A and 11B are explanatory diagrams for describing the operating of the peak hold circuit shown in FIG. 9.
Figure 11B:
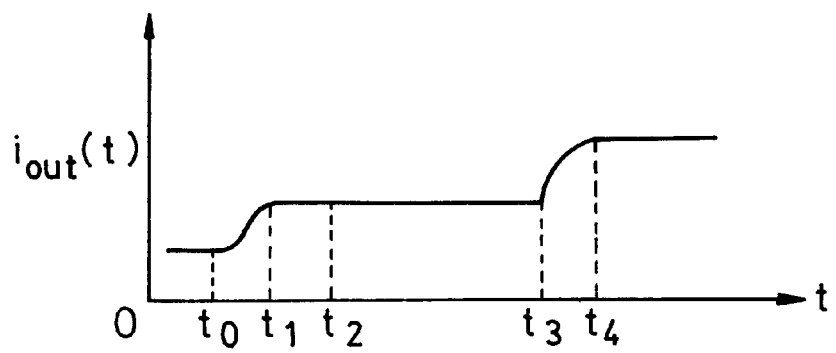

(1) In the event that the iin(t) increases over a period from time t0 to time t1 as shown in FIG. 11A, iD(t)<iin(t) holds, so the voltage of the node 916 rises as to the two reference potentials VBIAS1 and VBIAS2. At this time, the NPN transistor 914 maintains the cut-off state, but at the point that the voltage of the node 916 rises around 0.5 V as to the reference potential VBIAS1, the PNP transistor 913 enters the forward activation range and begins to cause current to flow, and at the point that the voltage rises around 0.7 V, the PNP transistor 913 turns on.

Then, current iin(t)−iD(t) flows from the node 915 via the PNP transistor 913, and the voltage of the node 915 rises so that iin(t) and iD(t) match. The charge of the parasitic capacity between the gate sources of the N-MOS transistors 911 and 912 connected to the node 915 is supplied to the node 915 via the PNP transistor 913, and the voltage of the node 915 rises.

At this time, the current mode current control circuit 91 acts as a current mirror circuit, and output current iout(t) proportionate to the input current iin(t) is obtained.

Now, taking note of the change in the absolute potential of the node 916, as described above, the voltage of the node 916 rises as to the two reference potentials VBIAS1 and VBIAS2 when iD(t)<iin(t) holds. At this time, n·iD(t)<n·iin(t) holds, so the reference potential VBIAS1 and reference potential VBIAS2 drop, and in the event that the PNP transistor 913 is on, the reference potential VBIAS1 reaches (VDD−2.1 V), and the absolute potential of the node 916 is (VDD−1.4 V).

Figure 12:
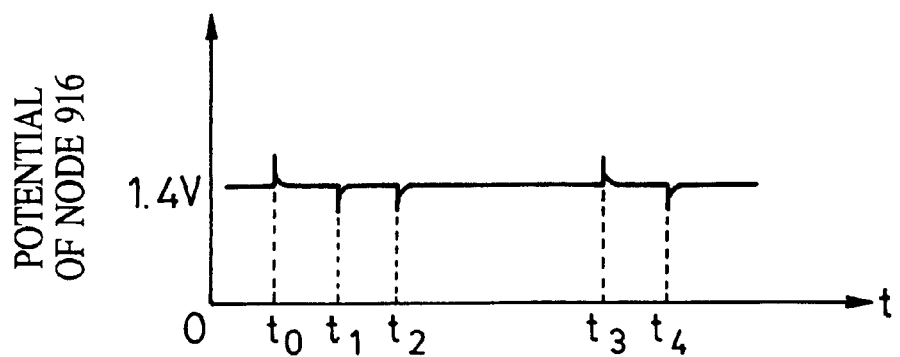
FIG. 12 is a diagram illustrating an example of fluctuation in the potential at the node 916 shown in FIG. 9.

As can be understood from FIG. 12 illustrating the potential of the node 916, the fluctuation in potential of the node 916 can be kept lower than conventional examples wherein the reference potential VBIAS1 and reference potential VBIAS2 have fixed potential.

(2) In the event that the increase of the input current iin(t), input via the input terminal, stops, such as over a period from time t1 to time t2, iD(t)=iin(t) holds, and the voltage of the node 916 drops as to the two reference potentials VBIAS1 and VBIAS2, so that both the PNP transistor 913 and PNP transistor 914 reach cut-off, and settles down at around the average potential of the reference potentials VBIAS1 and VBIAS2.

Now, the node 915 is in a high-impedance state, so the charge at time t1 does not change, and the voltage between the gate sources of the N-MOS transistors 911 and 912 is maintained at VGS(t1). Accordingly, the output current iout(t) is maintained at a current proportionate to the input current iin(t1) at time t1.

Now, taking note of the change in the absolute potential of the node 916, as described above, when iD(t)=iin(t) holds, the voltage of the node 916 drops as to the two reference potentials VBIAS1 and VBIAS2, and settles down at around the average potential thereof. However, n·iD(t)=n·iin(t) holds, so the reference potential VBIAS1 and reference potential VBIAS2 rise, to (VDD−1.75 V) and (VDD−1.05 V) respectively. Accordingly, the absolute potential of the node 916 is generally (VDD−1.4 V) which is the average potential thereof.

As can be understood from FIG. 12, the fluctuation in potential of the node 916 can be kept lower than conventional examples wherein the reference potential VBIAS1 and reference potential VBIAS2 have fixed potential.

In the event that the input current iin(t) is smaller than the input current iin(t1), such as in a period from time t2 to time t3, voltage of the node 916 further drops, as to the two reference potentials VBIAS1 and VBIAS2. However, the PNP transistor 913 maintains the cut-off state, so VGS(t1) is maintained, and the value of the output current iout(t) at time t1 is maintained. Now, at the point that the voltage of the node 916 drops around 0.7 V as to the reference potential VBIAS2, the NPN transistor 914 enters the forward activation range and turns on, and the current of iD(t)−iin(t), i.e., iin(t1)−iin(t), flows.

Taking note of the change in the absolute potential of the node 916 at this time, as described above, the voltage of the node 916 further drops as to the two reference potentials VBIAS1 and VBIAS2. At this time, n·iD(t)>n·iin(t) holds, so the reference potential VBIAS1 and reference potential VBIAS2 rise further, and in the event that the NPN transistor 914 is on, the reference potential VBIAS2 reaches (VDD−0.7 V). Accordingly, the absolute potential of the node 916 is approximately (VDD−1.4 V).

As can be understood from FIG. 12, the fluctuation in potential of the node 916 can be kept lower than conventional examples wherein the reference potential VBIAS1 and reference potential VBIAS2 have fixed potential.

(4) In the event that current iin(t) exceeding the input current iin(t1) is input from the input terminal such as in a period from time t3 to time t4 and continues to increase, the voltage of the node 916 drops as to the two reference potentials VBIAS1 and VBIAS2, and at the point that the voltage rises around 0.5 V as to the reference potential VBIAS1, the PNP transistor 913 enters the forward activation range again and begins to cause current to flow, the voltage rises to around 0.7 V and PNP transistor 913 turns on. Then, a current iin(t)−iD(t) flows to the node 915 via the PNP transistor 913, and the voltage of the node 915 rises so that iin(t) and iD(t) match. Thus, output current iout(t) corresponding to the input current iin(t) is obtained.

On the other hand, taking note of the change in the absolute potential of the node 916 at this time, as described above, the voltage of the node 916 rises as to the two reference potentials VBIAS1 and VBIAS2. However, n·iD(t)<n·iin(t) holds at this time, so the reference potential VBIAS1 and reference potential VBIAS2 drop, and in the event that the PNP transistor 913 is on, the reference potential VBIAS1 reaches (VDD−2.1 V). Accordingly, the absolute potential of the node 916 is approximately (VDD−1.4 V).

As can be understood from FIG. 12, the fluctuation in potential of the node 916 can be kept lower than conventional examples wherein the reference potential VBIAS1 and reference potential VBIAS2 have fixed potential.

According to the present embodiment, the fluctuation in absolute potential of the node 916 is far less than conventional examples wherein the reference potential VBIAS1 and reference potential VBIAS2 have fixed potential, and further, output current according to the peak value of the input current can be obtained for input currents with little change in magnitude at higher speeds.

Sixth Embodiment

Figure 13:
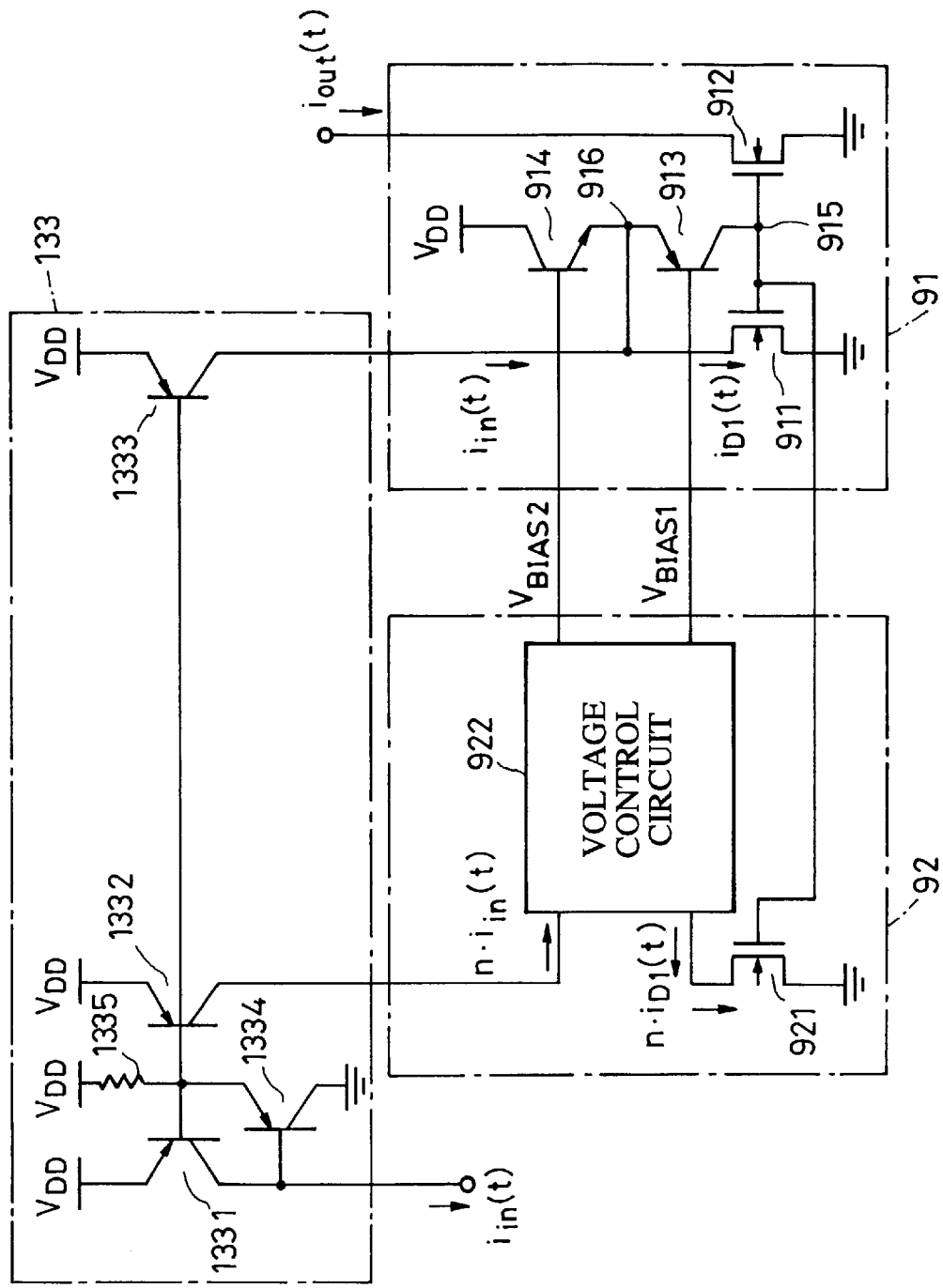
FIG. 13 is a circuit diagram illustrating a sixth embodiment of the present invention.

FIG. 13 illustrates a sixth embodiment of the present invention. The present embodiment differs from the fifth embodiment in that the configuration of the current mirror circuit differs.

That is, with the fifth embodiment, the current mirror circuit 93 shown in FIG. 9 is configured of PNP transistors 931, 932, and 933, so as to generate three constant-current sources.

Conversely, with the present embodiment, the current mirror circuit 133 comprises a PNP transistor 1331 with the collector thereof connected to the input terminal, a PNP transistor 1334, a resistor 1335, and a PNP transistor 1332, thus making up a three-transistor current mirror circuit, and a PNP transistor 1333, so as to generate three constant-current sources.

Seventh Embodiment

Figure 14:
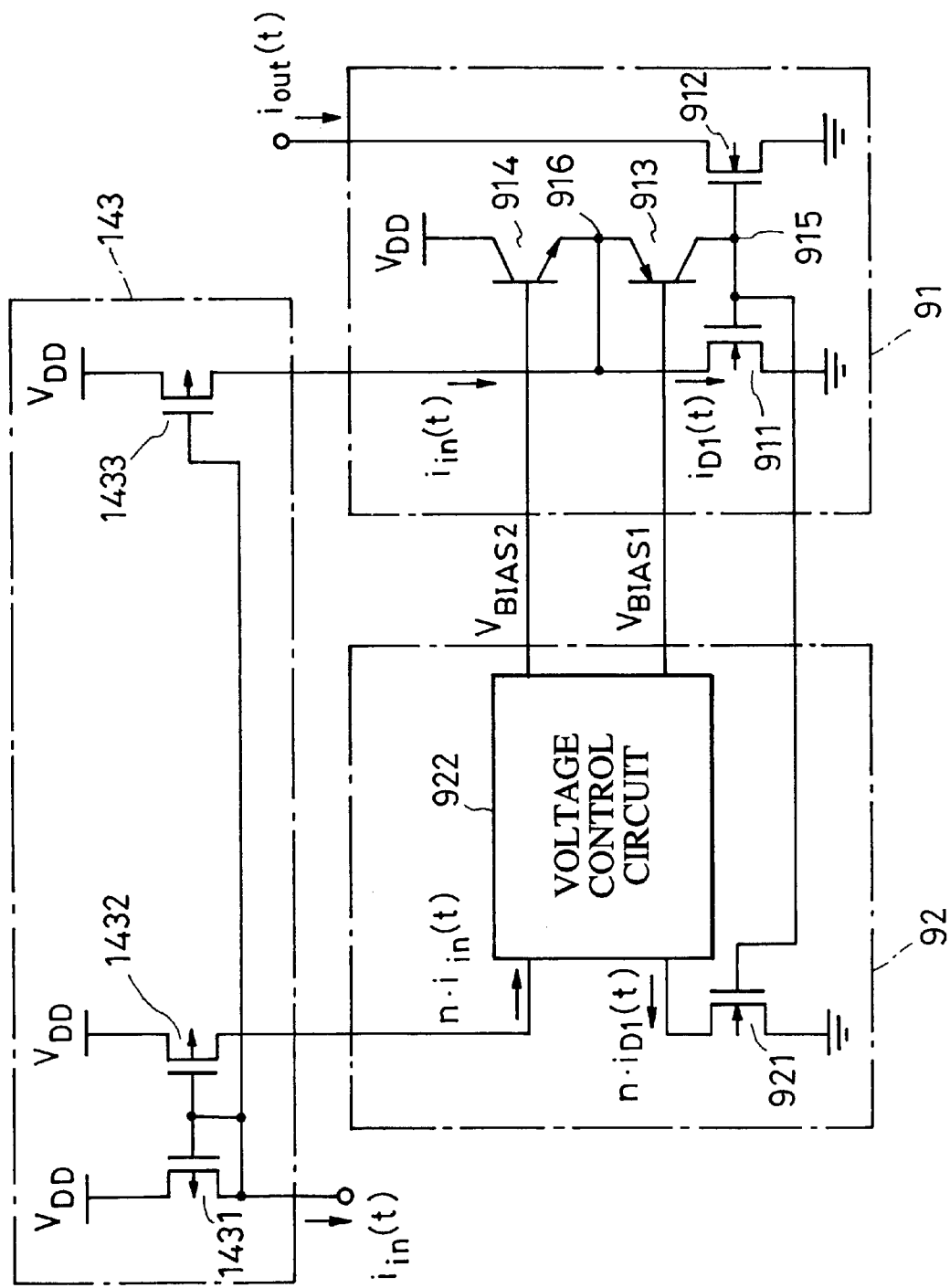
FIG. 14 is a circuit diagram illustrating a seventh embodiment of the present invention.

FIG. 14 illustrates a seventh embodiment of the present invention. The present embodiment differs from the fifth embodiment in that the configuration of the current mirror circuit differs. That is, with the fifth embodiment, the current mirror circuit 93 shown in FIG. 9 is configured of PNP transistors 931, 932, and 933, so as to generate two constant-current sources.

Conversely, with the present embodiment, the current mirror circuit substitutes P-MOS transistors 1431, 1432, and 1433 for the PNP transistors 931, 932, and 933 in the current mirror circuit 93 of the fifth embodiment, shown in FIG. 9.

Eighth Embodiment

Figure 15:
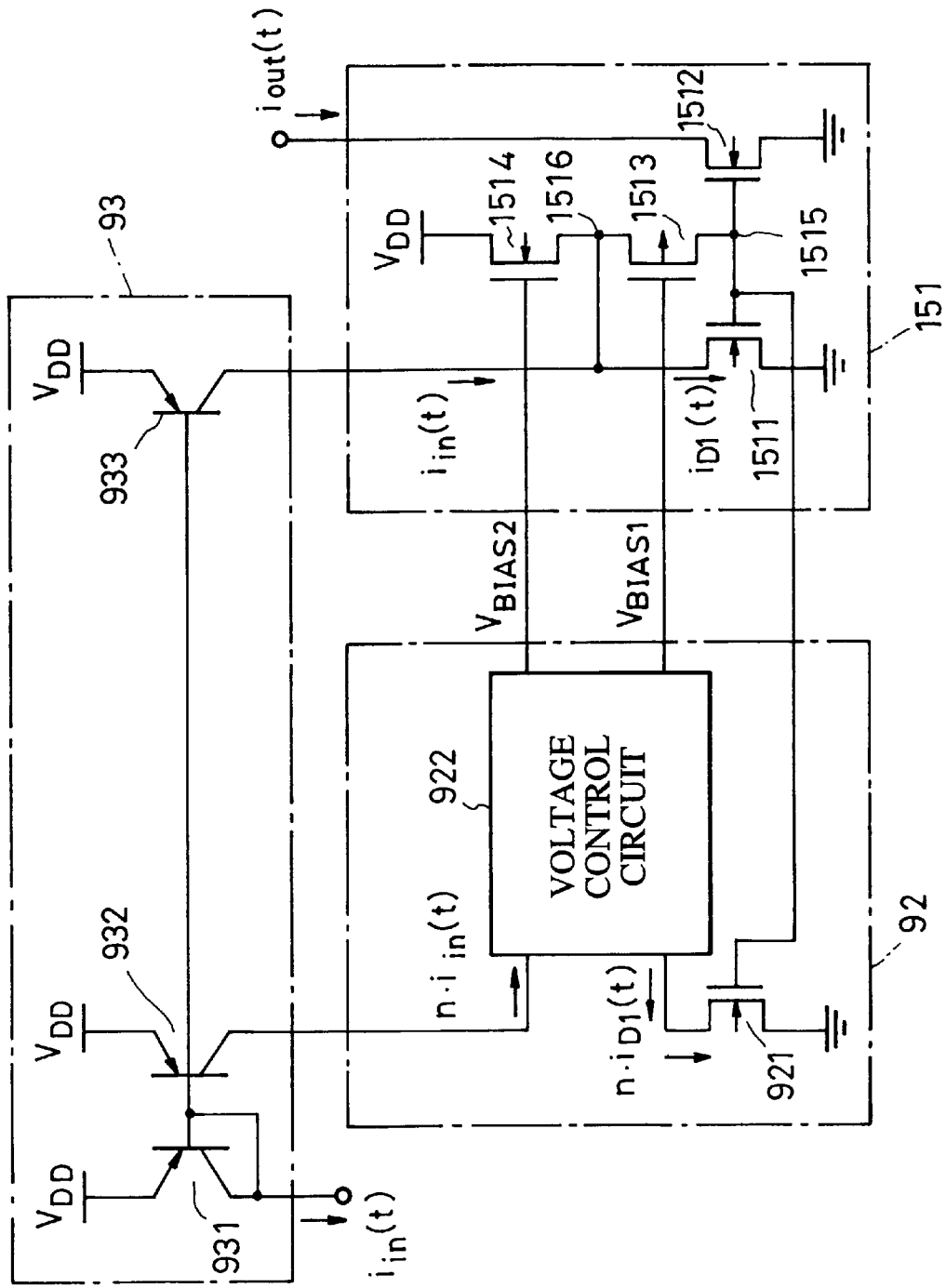
FIG. 15 is a circuit diagram illustrating an eighth embodiment of the present invention.

FIG. 15 illustrates an eighth embodiment of the present invention. The present embodiment differs from the fifth embodiment in that the configuration of the current control circuit differs.

That is, with the current control circuit 151 according to the present embodiment, the NPN transistor 913 and PNP transistor 914 of the current control circuit 91 according to the fifth embodiment shown in FIG. 9 is substituted with an N-MOS transistor 1513 and P-MOS transistor 1514.

Accordingly, in the event that the potential at the node 1516 rises in comparison to the reference potential VBIAS1 by the threshold potential of the P-MOS transistor 1513 or more, the P-MOS transistor 1513 turns on, while in the event that the potential at the node 716 drops in comparison to the reference potential VBIAS2 by the threshold potential of the N-MOS transistor 1514 or more, the N-MOS transistor 1514 turns on.

Figure 16:
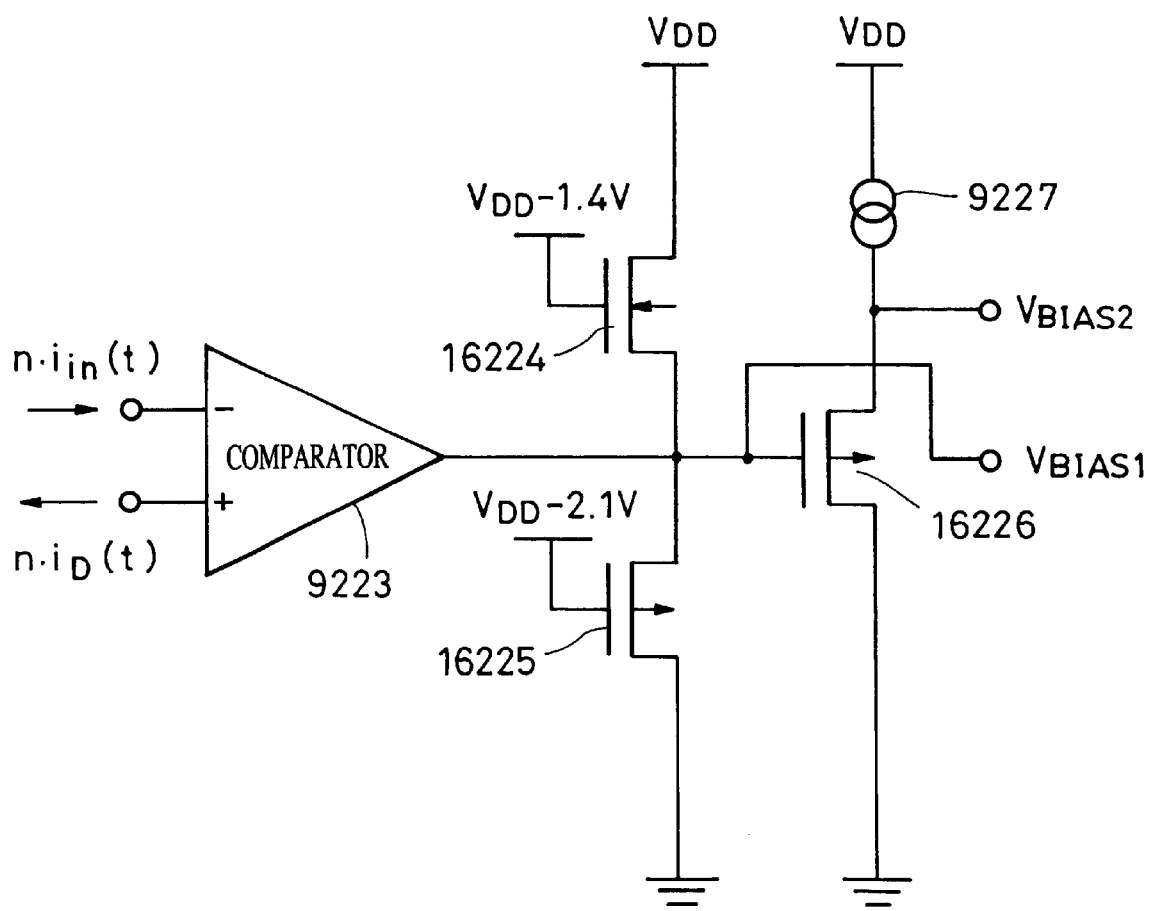
FIG. 16 is a circuit diagram illustrating the configuration of a voltage control circuit substitutable with the voltage control circuit 922 shown in FIG. 14.

The voltage control circuit 22 according to the present embodiment may be substituted with a voltage control circuit of a configuration shown in FIG. 16. This voltage control circuit has the NPN transistor 9244, PNP transistor 9225, and NPN transistor 9226 of the voltage control circuit 922 shown in FIG. 10 substituted with an N-MOS transistor 16224, a P-MOS transistor 16225, and an N-MOS transistor 16226, respectively.

Further note that the current mirror circuit 93 according to the present embodiment may be substituted with either current mirror circuit 133 or 143, shown in FIGS. 13 and 14, according to the sixth and seventh embodiments.

Ninth Embodiment

Figure 17:
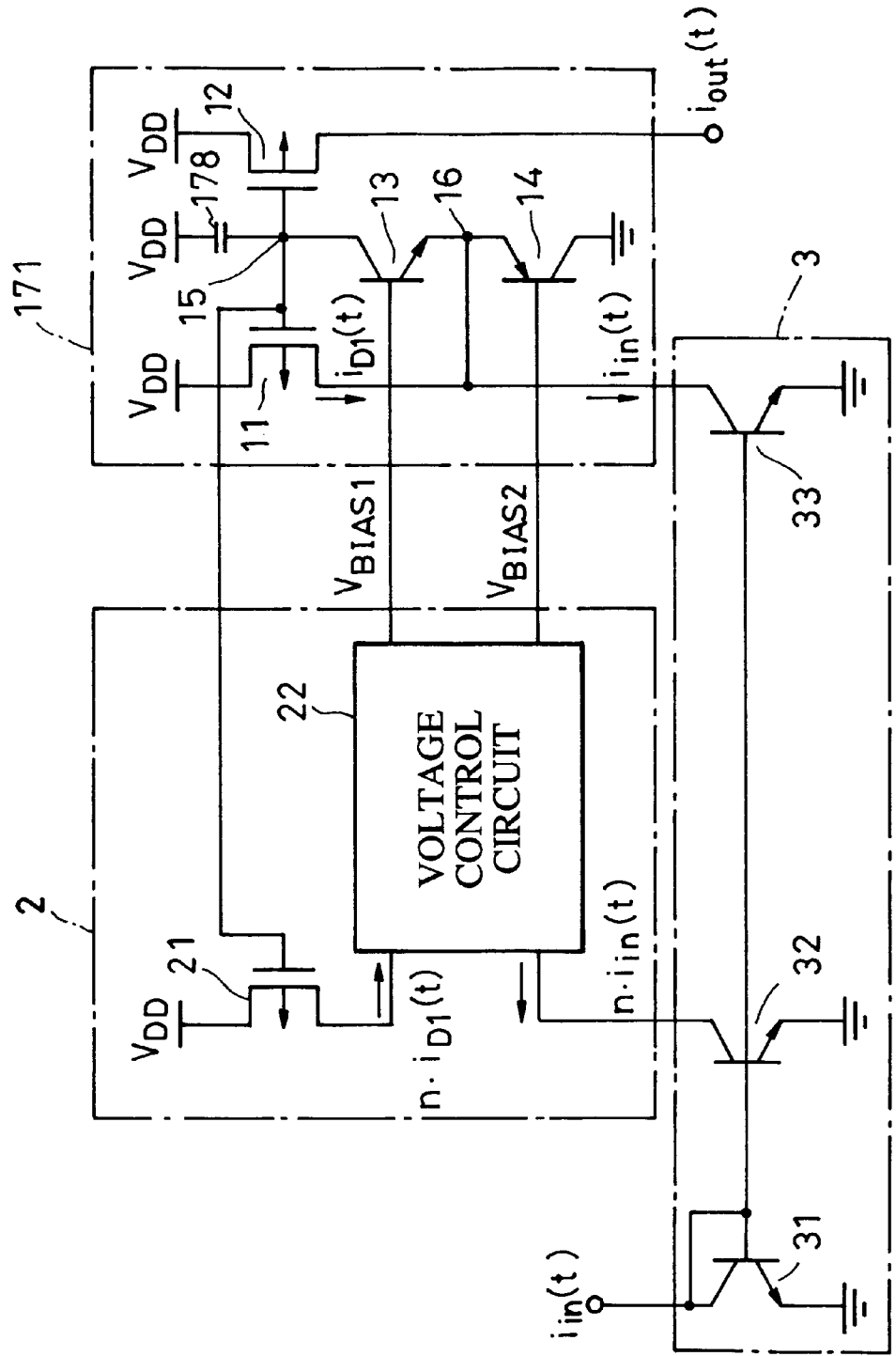
FIG. 17 is a circuit diagram illustrating a ninth embodiment of the present invention.

FIG. 17 illustrates a ninth embodiment of the present invention. The present embodiment differs from the first embodiment in that the configuration of the current control circuit differs. That is, with the current control circuit 171 according to the present embodiment, the node 15 in the current control circuit 1 according to the first embodiment shown in FIG. 1 is connected to the electric power source VDD via a capacitor 178.

According to such a configuration, at the time that the voltage of the node 15 drops, charge is extracted from the charge holding capacitor 178 connected to the node 15 via the NPN transistor 13, in addition to the parasitic capacity between the gate and source of the P-MOS transistors 11 and 12 connected to the node 15.

The capacity at the node 15 is greater than that in the first embodiment by the capacity of the capacitor 178, so the charge held there is also greater. Accordingly, in the event that there is a leak current at the node 15, the voltage fluctuation margin of error at the node 15 following a predetermined amount of time can be reduced as compared to that with the first embodiment, so output current corresponding to the peak value of the input current can be obtained in a more stable manner.

Further note that the current mirror circuit 3 according to the ninth embodiment may be substituted with either current mirror circuit 53 or 63, shown in FIGS. 5 and 6, according to the second and third embodiments.

Tenth Embodiment

Figure 18:
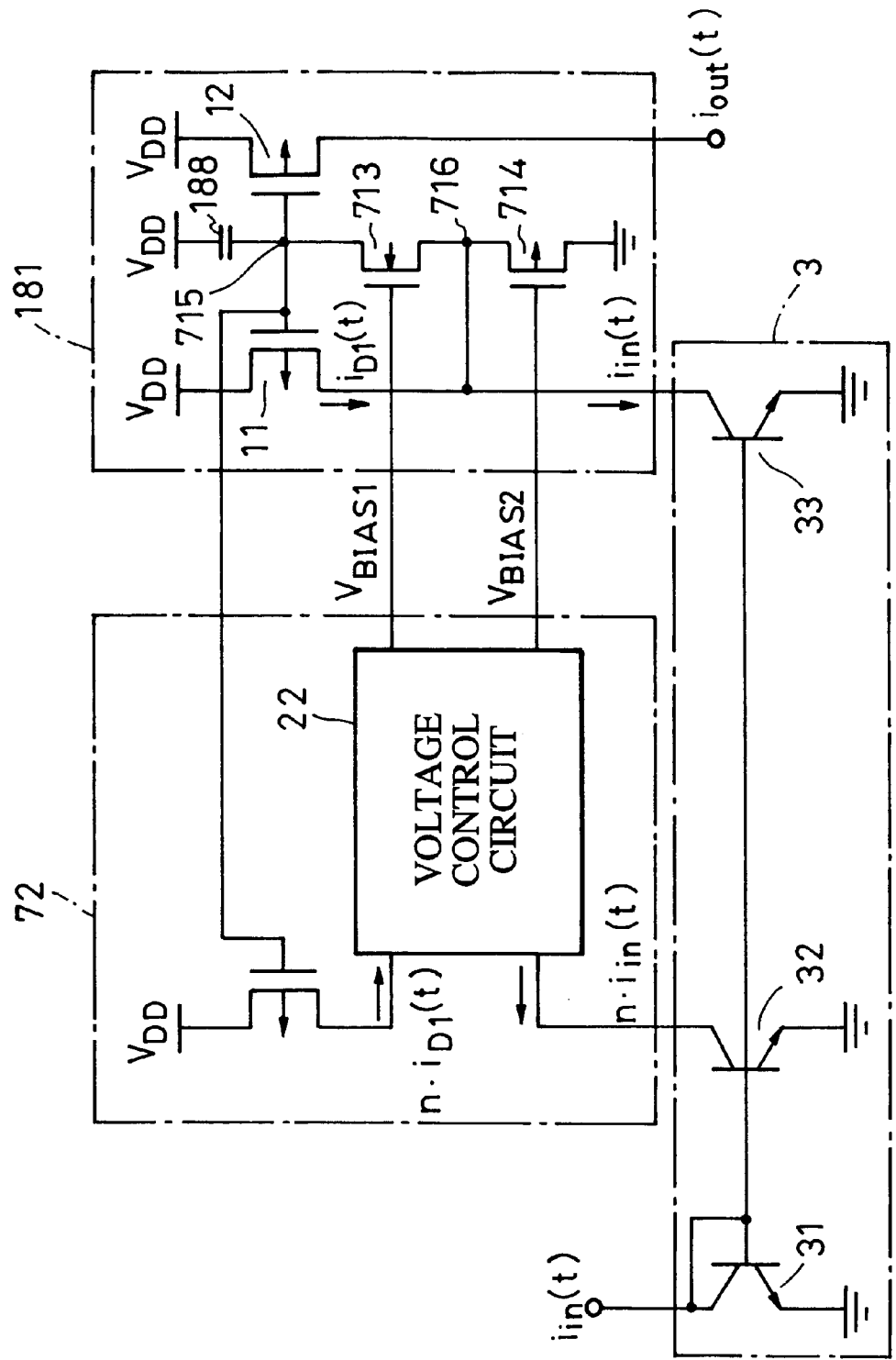
FIG. 18 is a circuit diagram illustrating a tenth embodiment of the present invention.

FIG. 18 illustrates a tenth embodiment of the present invention. The present embodiment differs from the fourth embodiment in that the configuration of the current control circuit differs. That is, with the current control circuit 181 according to the present embodiment, the node 715 in the current control circuit 71 according to the fourth embodiment shown in FIG. 7 is connected to the electric power source VDD via a capacitor 188.

According to such a configuration, at the time that the voltage of the node 715 drops, charge is extracted from the charge holding capacitor 188 connected to the node 715 via the NPN transistor 713, in addition to the parasitic capacity between the gate and source of the P-MOS transistors 11 and 12 connected to the node 715.

The capacity at the node 715 is greater than that in the fourth embodiment by the capacity of the capacitor 188, so the charge held there is also greater. Accordingly, in the event that there is a leak current at the node 715, the voltage fluctuation margin of error at the node 715 following a predetermined amount of time can be reduced as compared to that with the fourth embodiment, so output current corresponding to the peak value of the input current can be obtained in a more stable manner.

Further note that the current mirror circuit 3 according to the present embodiment may be substituted with either current mirror circuit 53 or 63, shown in FIGS. 5 and 6, according to the second and third embodiments.

Eleventh Embodiment

Figure 19:
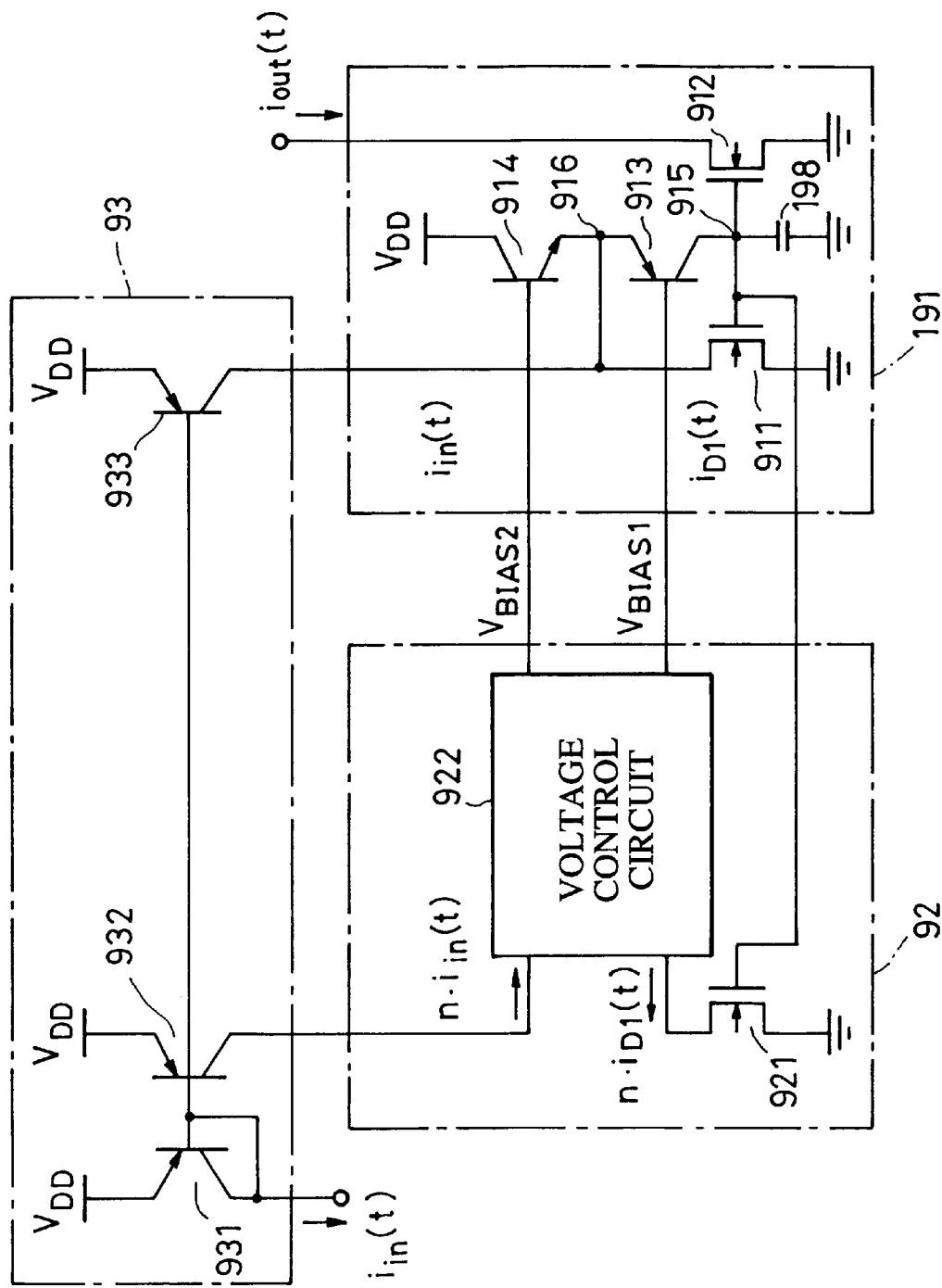
FIG. 19 is a circuit diagram illustrating a eleventh embodiment of the present invention.

FIG. 19 illustrates an eleventh embodiment of the present invention. The present embodiment differs from the fifth embodiment in that the configuration of the current control circuit differs. That is, with the current control circuit 191 according to the present embodiment, the node 915 in the current control circuit 91 according to the fifth embodiment shown in FIG. 9 is grounded via a capacitor 198.

According to such a configuration, at the time that the voltage of the node 915 rises, charge is supplied from the charge holding capacitor 198 connected to the node 915 via the PNP transistor 913, in addition to the parasitic capacity between the gate and source of the N-MOS transistors 911 and 912 connected to the node 915.

The capacity at the node 915 is greater than that in the fifth embodiment by the capacity of the capacitor 198, so the charge held there is also greater. Accordingly, in the event that there is a leak current at the node 915, the voltage fluctuation margin of error at the node 915 following a predetermined amount of time can be reduced as compared to that with the fifth embodiment, so output current corresponding to the peak value of the input current can be obtained in a more stable manner.

Further note that with the current mirror circuit 93 according to the present embodiment shown in FIG. 9, the current mirror circuit 93 according to the fifth embodiment may be substituted with either current mirror circuit 133 or 143, shown in FIGS. 13 and 14, according to the sixth and seventh embodiments.

Twelfth Embodiment

Figure 20:
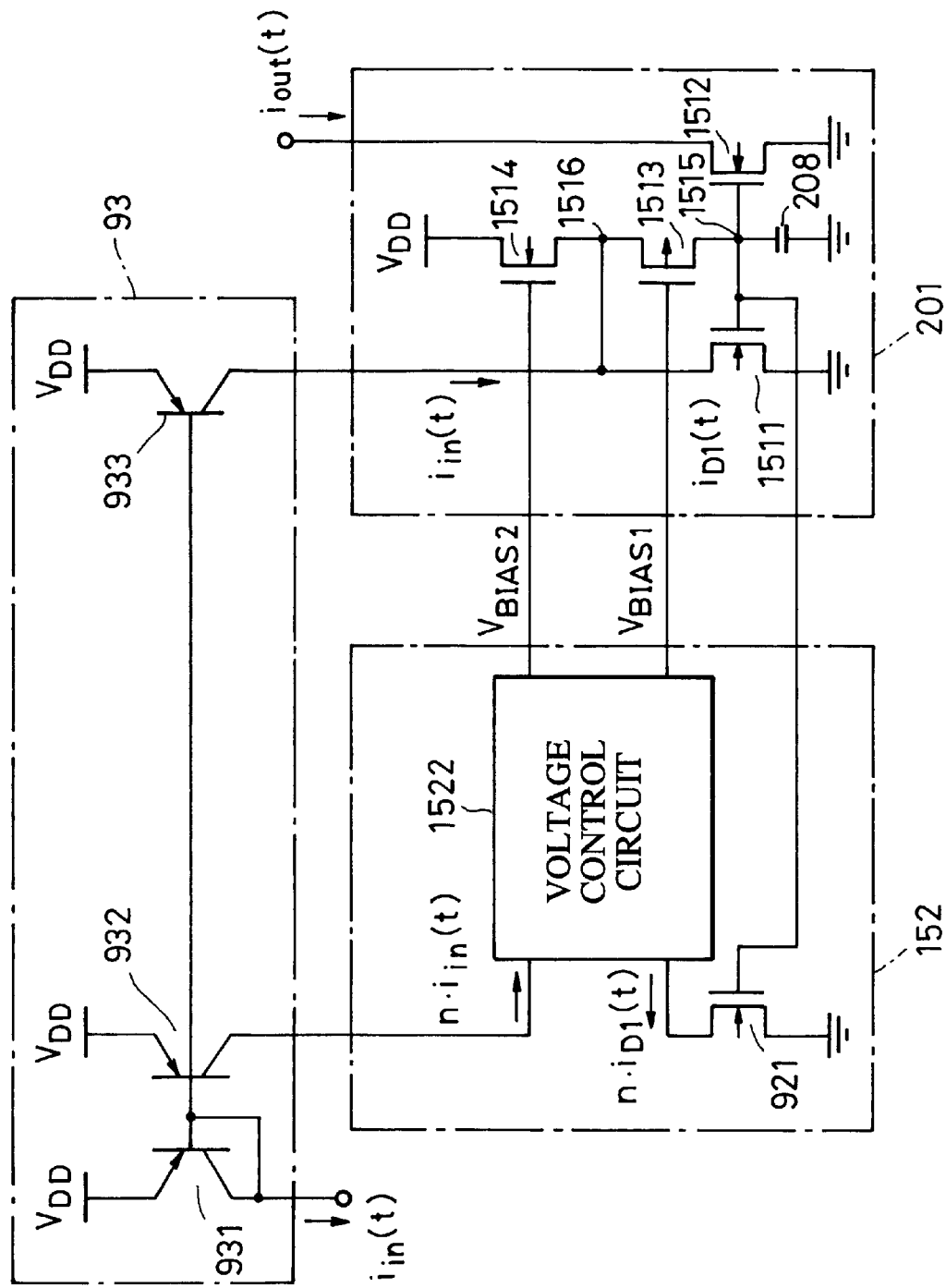
FIG. 20 is a circuit diagram illustrating a twelfth embodiment of the present invention.

FIG. 20 illustrates a twelfth embodiment of the present invention. The present embodiment differs from the eighth embodiment in that the configuration of the current control circuit differs. That is, with the current control circuit 201 according to the present embodiment, the node 1515 in the current control circuit 151 according to the eighth embodiment shown in FIG. 15 is grounded via a capacitor 208.

According to such a configuration, at the time that the voltage of the node 1515 rises, charge is supplied from the charge holding capacitor 208 connected to the node 1515 via the NPN transistor 1513, in addition to the parasitic capacity between the gate and source of the P-MOS transistors 1511 and 1512 connected to the node 1515.

The capacity at the node 1515 is greater than that in the eighth embodiment by the capacity of the capacitor 208, so the charge held there is also greater. Accordingly, in the event that there is a leak current at the node 1515, the voltage fluctuation margin of error at the node 1515 following a predetermined amount of time can be reduced as compared to that with the eighth embodiment, so output current corresponding to the peak value of the input current can be obtained in a more stable manner.

Note that the current mirror circuit 93 according to the present invention may be substituted with either current mirror circuit 133 or 143, shown in FIGS. 13 and 14, according to the sixth and seventh embodiments.

Thirteenth Embodiment

Figure 21:
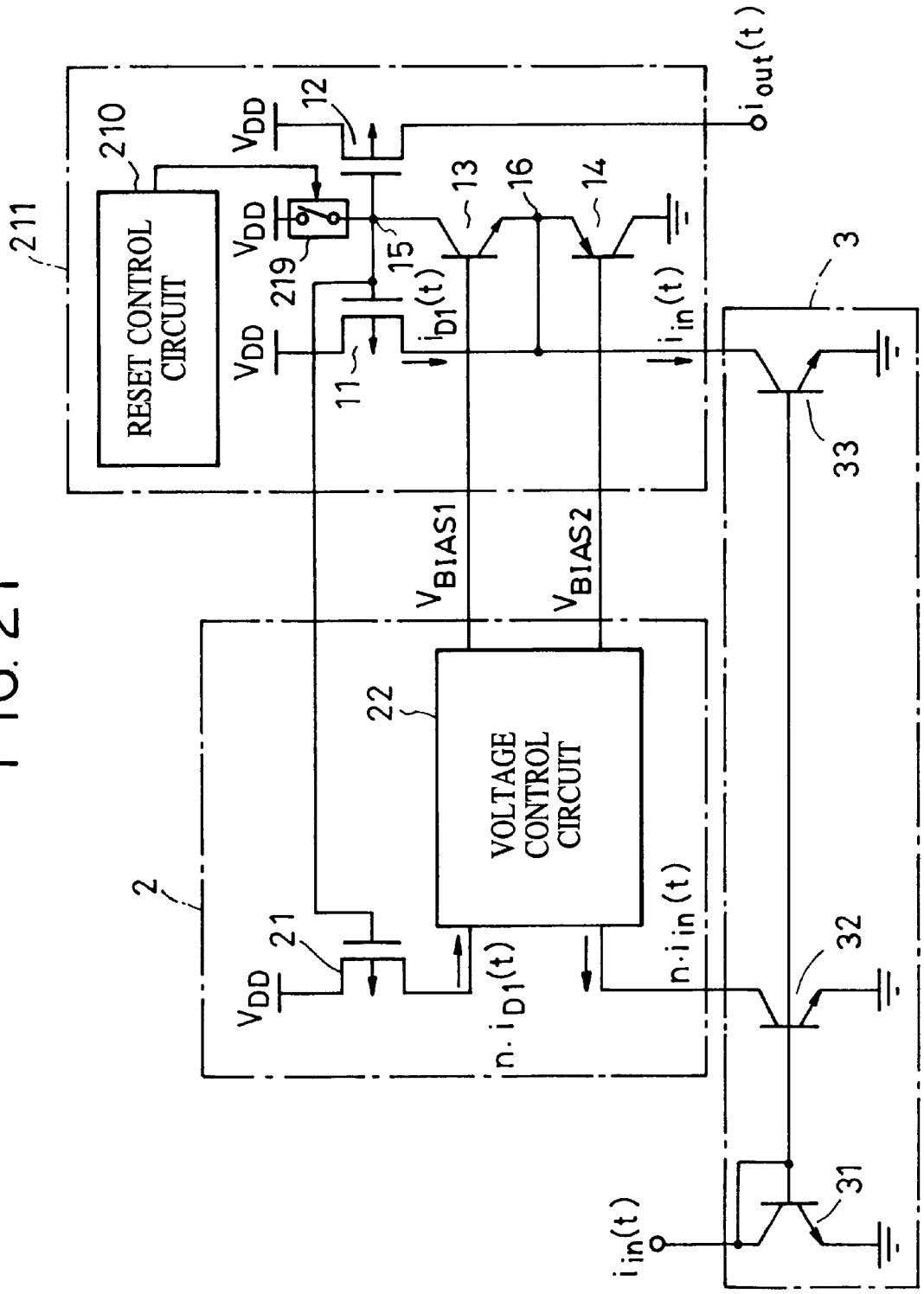
FIG. 21 is a circuit diagram illustrating a thirteenth embodiment of the present invention.

FIG. 21 illustrates a thirteenth embodiment of the present invention. The present embodiment differs from the first embodiment in that the configuration of the current control circuit differs. That is, with the current control circuit 211 according to the present embodiment, the node 15 in the current control circuit 1 according to the first embodiment shown in FIG. 1 is connected to the electric power source VDD via a switch 219, and ON/OFF control of the switch 219 is performed by a reset control circuit 210.

In the event that the switch 219 is turned off by the reset control circuit 210, the current control circuit 211 according to the present embodiment operates in the same manner as the current control circuit 1 according to the first embodiment shown in FIG. 1. On the other hand, in the event that the switch 219 is turned on by the reset control circuit 210, the node 15 is short-circuited to the electric power source VDD, and the potential of the node 15 can be set to the potential of the electric power source VDD.

Accordingly, following a peak holding action, the switch 219 is turned on, and following boosting the voltage of the node 15 to the voltage of the electric power source VDD, the switch 219 is turned off. Subsequently, the current control circuit 211 operates in the same manner as the current control circuit 1 according to the first embodiment, and a new peak holding action is carried out.

Note that the node 15 of the current control circuit 171 shown in FIG. 17 may be connected to the electric power source VDD via the switch 219, so as to perform ON/OFF control of the switch 219 by the reset control circuit 210.

Further note that the current mirror circuit 211 according to the present embodiment may be substituted with either current mirror circuit 53 or 63, shown in FIGS. 5 and 6, according to the second and third embodiments.

Fourteenth Embodiment

Figure 22:
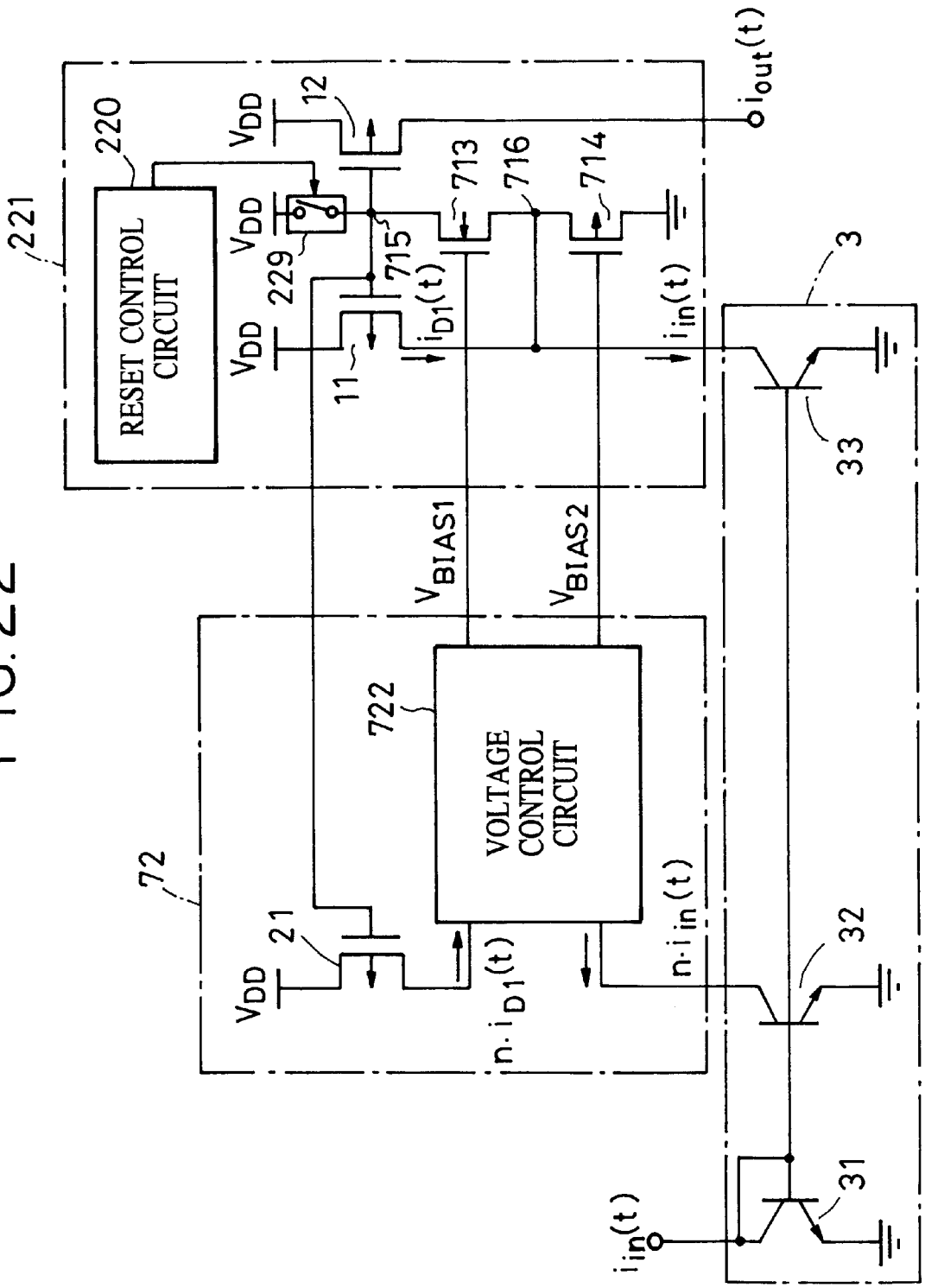
FIG. 22 is a circuit diagram illustrating a fourteenth embodiment of the present invention.

FIG. 22 illustrates a fourteenth embodiment of the present invention. The present embodiment differs from the fourth embodiment in that the configuration of the current control circuit differs. That is, with the current control circuit 221 according to the present embodiment, the node 715 in the current control circuit 71 according to the fourth embodiment shown in FIG. 7 is connected to the electric power source VDD via a switch 229, and ON/OFF control of the switch 229 is performed by a reset control circuit 220.

In the event that the switch 229 is turned off by the reset control circuit 220, the current control circuit 221 according to the present embodiment operates in the same manner as the current control circuit 71 according to the fourth embodiment shown in FIG. 7. On the other hand, in the event that the switch 229 is turned on by the reset control circuit 220, the node 715 is short-circuited to the electric power source VDD, and the potential of the node 715 can be set to the potential of the electric power source VDD.

Accordingly, following a peak holding action, the switch 229 is turned on, and following boosting the voltage of the node 715 to the voltage of the electric power source VDD, the switch 229 is turned off. Subsequently, the current control circuit 221 operates in the same manner as the current control circuit 1 according to the fourth embodiment, and a new peak holding action is carried out.

Note that the node 715 of the current control circuit 181 shown in FIG. 18 may be connected to the electric power source VDD via the switch 229, so as to perform ON/OFF control of the switch 229 by the reset control circuit 220.

Further note that the current mirror circuit 221 according to the present embodiment may be substituted with either current mirror circuit 53 or 63, shown in FIGS. 5 and 6, according to the second and third embodiments.

Fifteenth Embodiment

Figure 23:
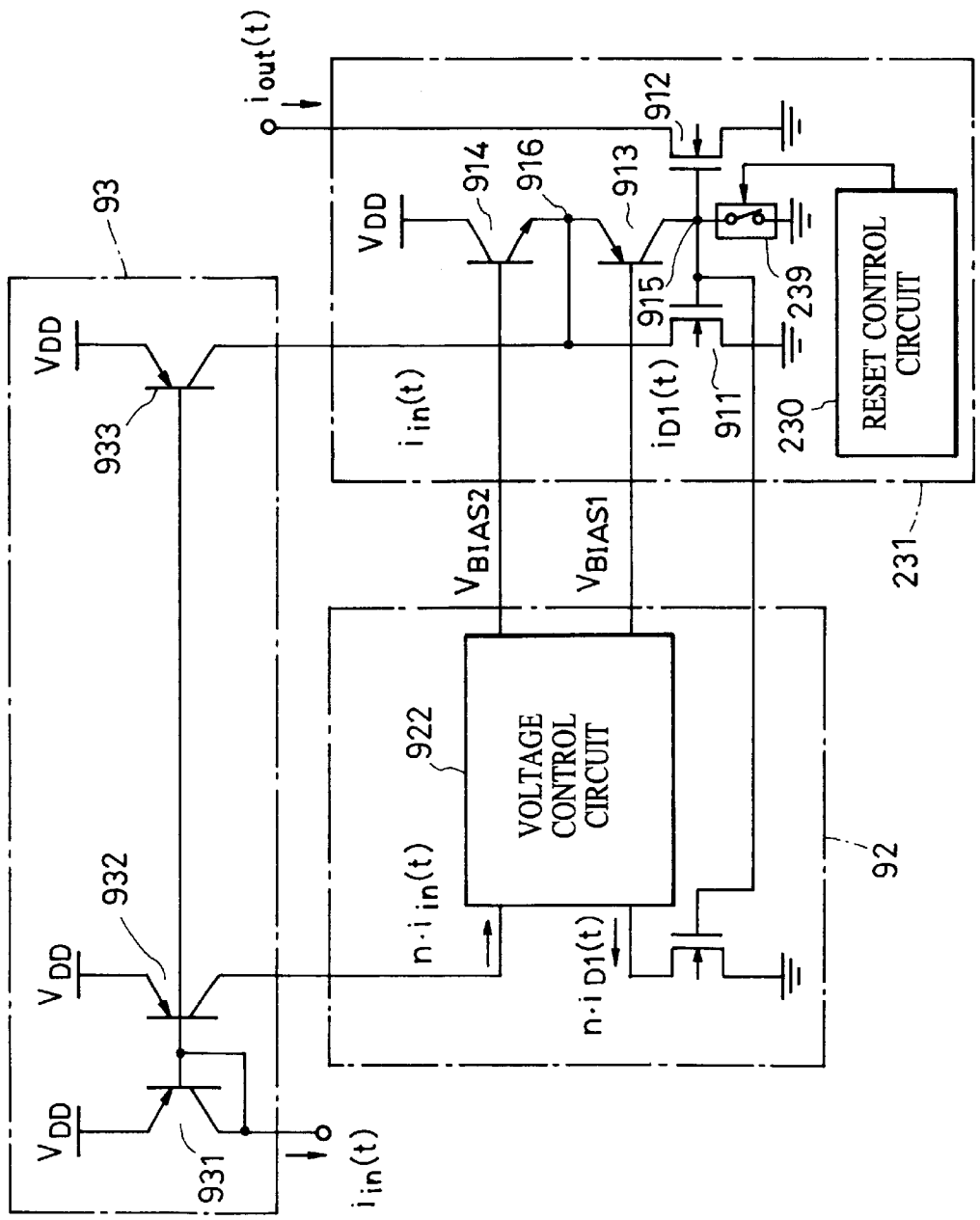
FIG. 23 is a circuit diagram illustrating a fifteenth embodiment of the present invention.
Figure 24:
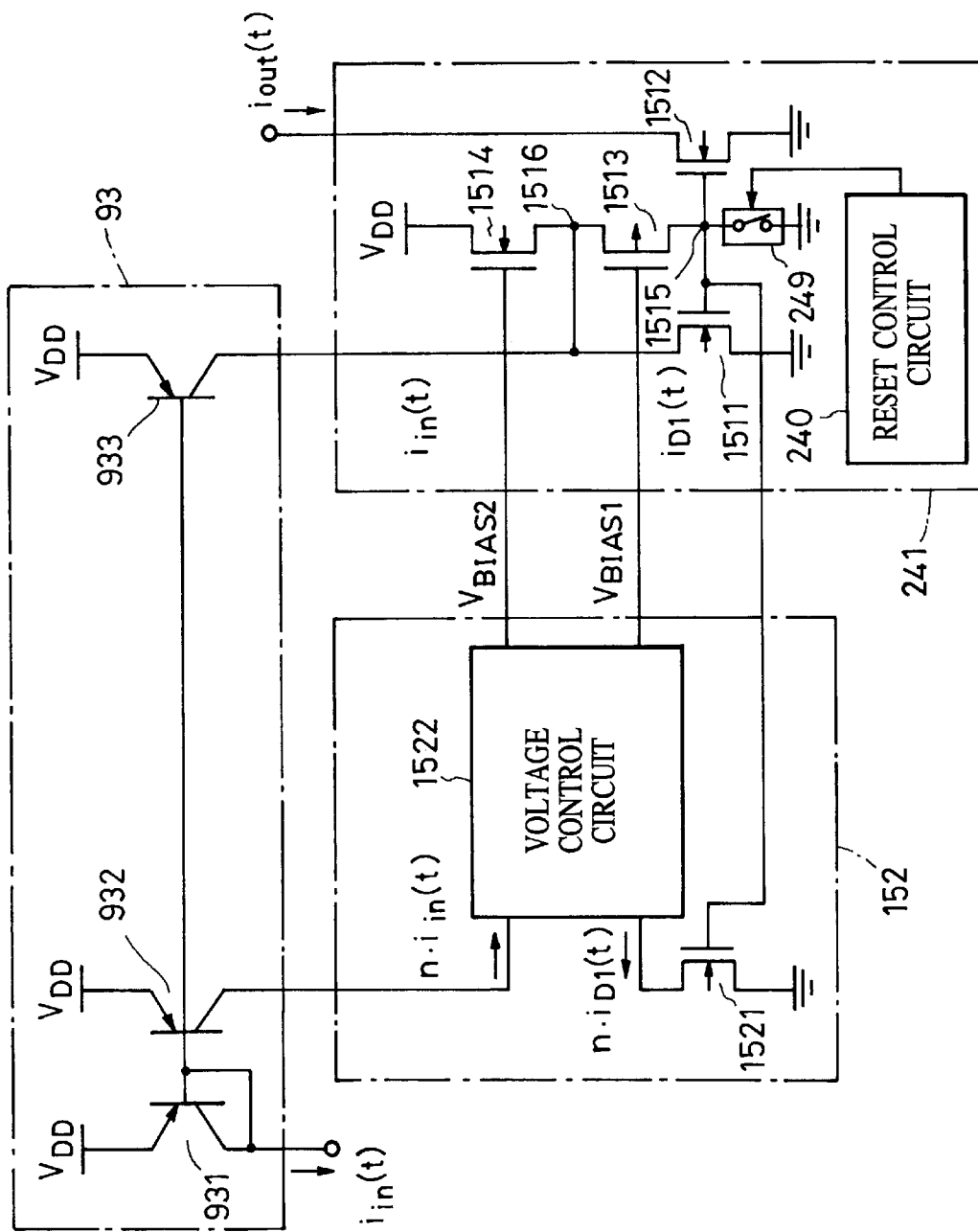
FIG. 24 is a circuit diagram illustrating a sixteenth embodiment of the present invention.
Figure 25:
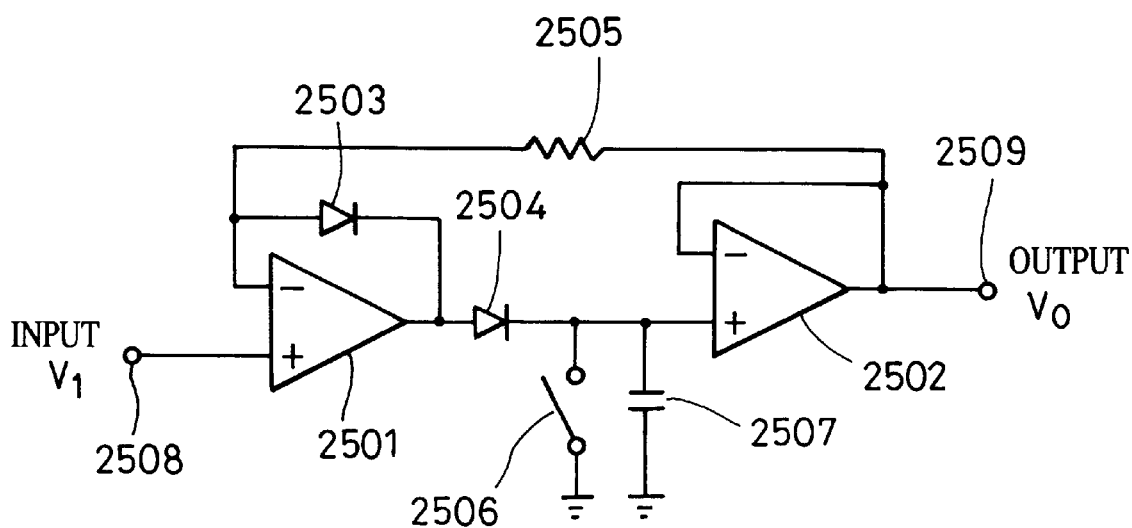
FIG. 25 is a circuit diagram illustrating an example of a voltage mode peak hold circuit.
Figure 26:
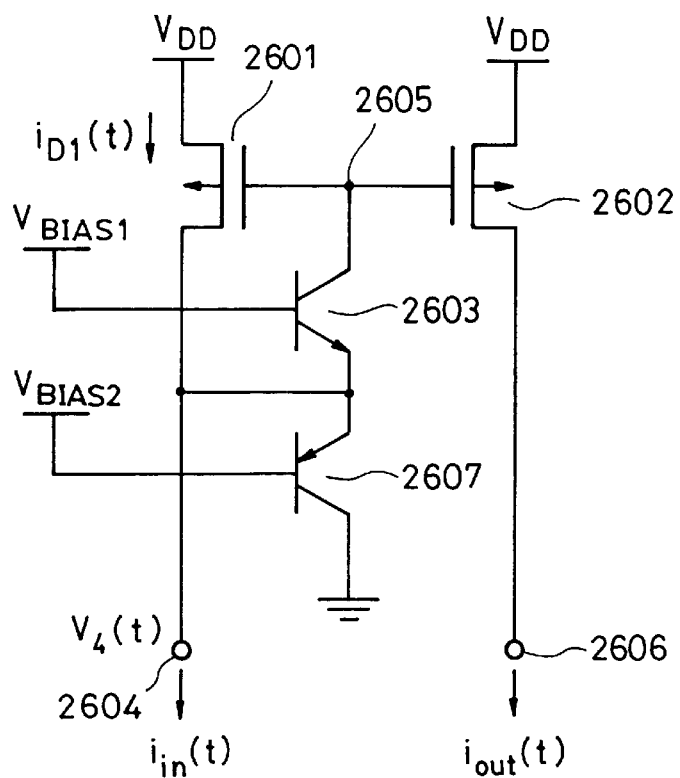
FIG. 26 is a circuit diagram illustrating an example of a conventional current mode peak hold circuit.
Figure 27A:
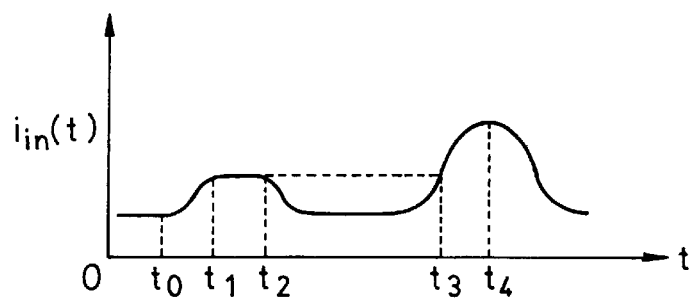
FIGS. 27A and 27B are explanatory diagrams describing the operation of the peak hold circuit shown in FIG. 20.
Figure 27B:
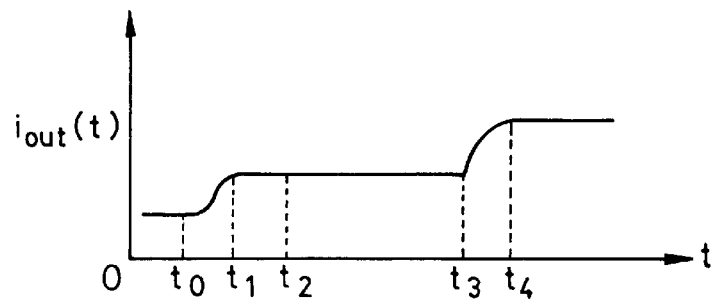
Figure 28:
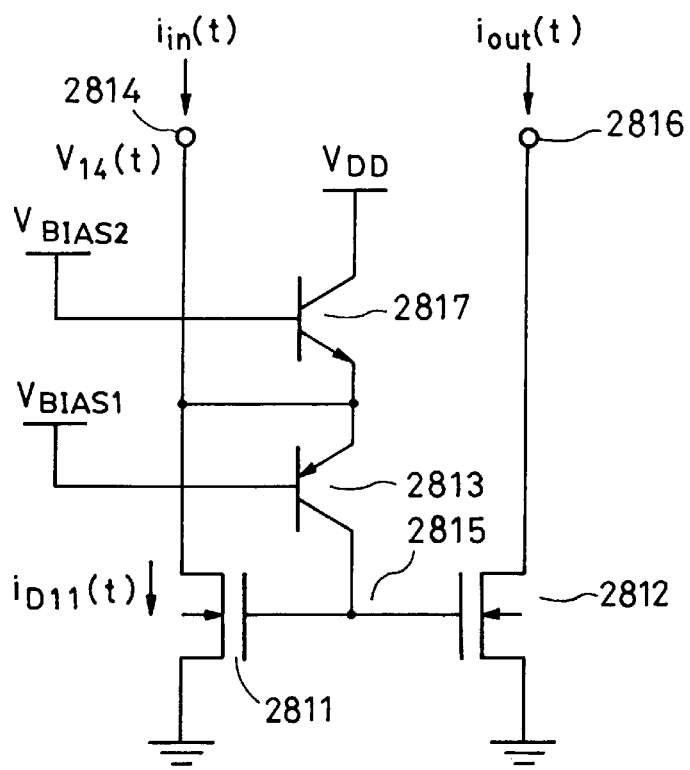
FIG. 28 is a circuit diagram illustrating another example of a conventional current mode peak hold circuit.
Figure 29A:
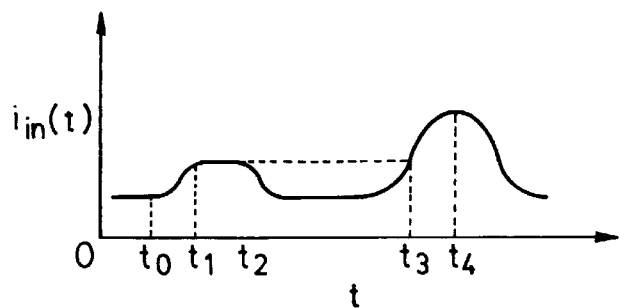
FIGS. 29A and 29B are explanatory diagrams describing the operation of the peak hold circuit shown in FIG. 24.
Figure 29B:
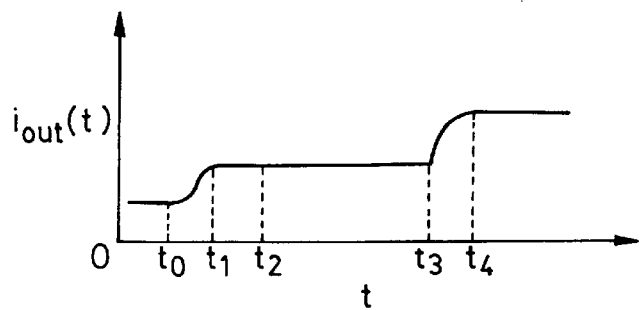
Figure 30:
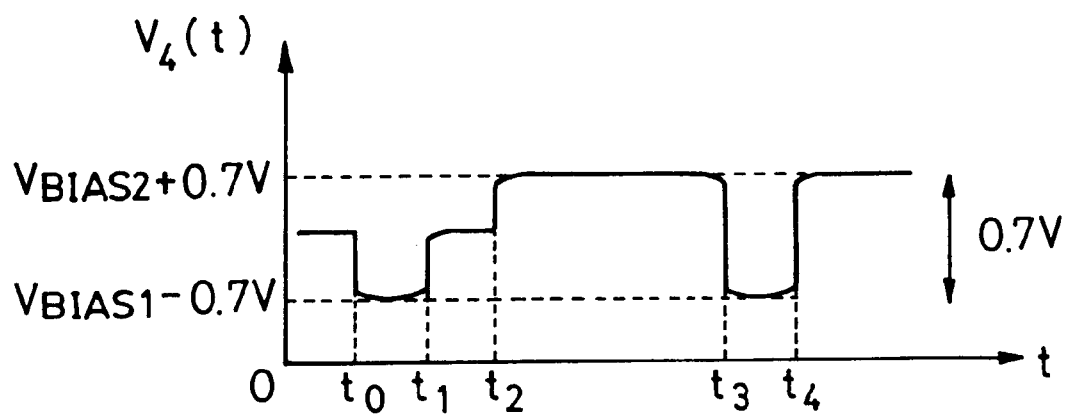
FIG. 30 is a diagram illustrating an example of fluctuation of voltage V4(t) as to the change in the input current iin(t) shown in FIG. 27A of the peak hold circuit shown in FIG. 26.
Figure 31:
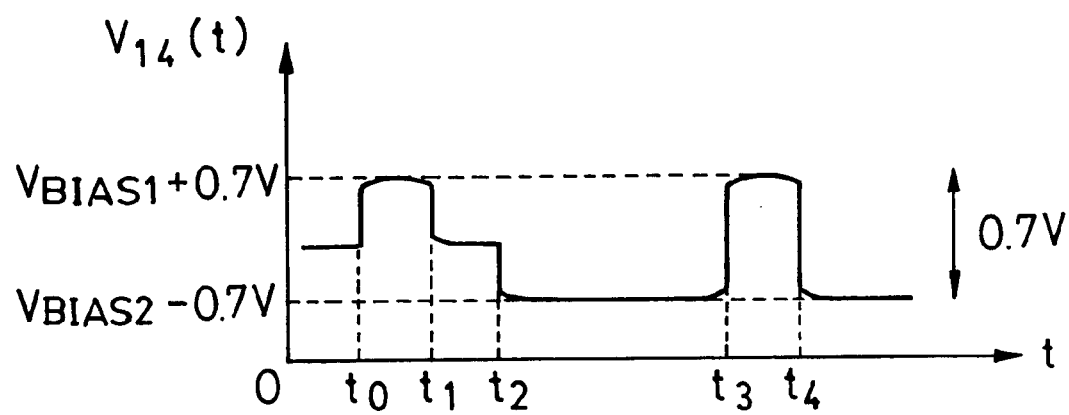
FIG. 31 is a diagram illustrating an example of fluctuation of voltage V14(t) as to the change in the input current iin(t) shown in FIG. 29A of the peak hold circuit shown in FIG. 28.

FIG. 23 illustrates a fifteenth embodiment of the present invention. The present embodiment differs from the fifth embodiment in that the configuration of the current control circuit differs. That is, with the current control circuit 231 according to the present embodiment, the node 915 in the current control circuit 91 according to the fifth embodiment shown in FIG. 9 is connected to the electric power source VDD via a switch 239, and ON/OFF control of the switch 239 is performed by a reset control circuit 230.

In the event that the switch 239 is turned off by the reset control circuit 230, the current control circuit 231 according to the present embodiment operates in the same manner as the current control circuit 91 according to the fifth embodiment shown in FIG. 9. On the other hand, in the event that the switch 239 is turned on by the reset control circuit 230, the node 915 is short-circuited to the ground, and the potential of the node 915 can be set to the ground potential.

Accordingly, following a peak holding action, the switch 239 is turned on, and following dropping the voltage of the node 915 to the ground voltage, the switch 239 is turned off. Subsequently, the current control circuit 231 operates in the same manner as the current control circuit 91 according to the fifth embodiment, and a new peak holding action is carried out.

Note that the node 915 of the current control circuit 191 shown in FIG. 19 may be connected to the electric power source VDD via the switch 239, so as to perform ON/OFF control of the switch 239 by the reset control circuit 230.

Further note that the current mirror circuit 93 according to the present embodiment may be substituted with either current mirror circuit 133 or 143, shown in FIGS. 13 and 14, according to the sixth and seventh embodiments.

Sixteenth Embodiment

FIG. 23 illustrates a sixteenth embodiment of the present invention. The present embodiment differs from the eighth embodiment in that the configuration of the current control circuit differs. That is, with the current control circuit 221 according to the present embodiment, the node 1515 in the current control circuit 151 according to the eighth embodiment shown in FIG. 15 is connected to the electric power source VDD via a switch 249, and ON/OFF control of the switch 249 is performed by a reset control circuit 240.

In the event that the switch 249 is turned off by the reset control circuit 240, the current control circuit 241 according to the present embodiment operates in the same manner as the current control circuit 151 according to the eighth embodiment shown in FIG. 15. On the other hand, in the event that the switch 249 is turned on by the reset control circuit 240, the node 1515 is short-circuited to the ground, and the potential of the node 1515 can be set to the ground potential.

Accordingly, following a peak holding action, the switch 249 is turned on, and following dropping the voltage of the node 1515 to the ground voltage, the switch 249 is turned off. Subsequently, the current control circuit 241 operates in the same manner as the current control circuit 151 according to the eighth embodiment shown in FIG. 15, and a new peak holding action is carried out.

Note that the node 1515 of the current control circuit 201 shown in FIG. 20 may be connected to the electric power source VDD via the switch 249, so as to perform ON/OFF control of the switch 249 by the reset control circuit 240.

Further note that the current mirror circuit 93 according to the present embodiment may be substituted with either current mirror circuit 133 or 143, shown in FIGS. 13 and 14, according to the sixth and seventh embodiments.

As described above, according to the present embodiment, due to the above-described configurations, output current corresponding to the peak value of input current can be obtained for input currents with little change in magnitude, at essentially higher speeds.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A peak hold circuit, comprising:

a current mirror circuit for generating
 a first constant-current source for causing flow of a current that is the same magnitude as an input current from an input terminal, and
 a second constant-current source for causing flow of a current that is said input current multiplied by a predetermined multiplication factor;

a first FET wherein the drain thereof is connected to said first constant-current source and the source thereof is connected to a first electric power source;

a second FET wherein the drain thereof is connected to an output terminal and the source thereof is connected to said first electric power source and the gate thereof is connected in common with the gate of said first FET;

a two-stage serial circuit comprising first and second transistors having complementary properties, provided between said gates connected in common and a second electric power source which has lower voltage than said first electric power source, wherein the nodes of said first and second transistors are connected to the drain of said first FET;

current detecting means for detecting the drain current of said first FET; and applied voltage control means which compare a current which is a drain current detected by said current detecting means multiplied by said predetermined multiplication factor, with a current which is said input current from said second constant-current source multiplied by said predetermined multiplication factor, and applies a first applied voltage which is lower than voltage of said first electric power source to said first transistor, and also applies to said second transistor a second applied voltage which is constantly lower than said first applied voltage by a predetermined voltage wherein said first and second transistors are not simultaneously turned on, wherein
 in the event that said detected current detected by said current detecting means is greater than the drain current of said first FET, said first voltage is applied as said first applied voltage to said first transistor so as to turn said first transistor on, and said second voltage is applied as said second applied voltage to said second transistor so as to turn said second transistor off,
 in the event that said detected current is smaller than said drain current, a third voltage lower by said first voltage by a predetermined voltage is applied as said first applied voltage to said first transistor so as to turn said first transistor off, and a fourth voltage lower by said second voltage by a predetermined voltage is applied as said second applied voltage to said second transistor so as to turn said second transistor on, and
 in the event that said detected current is equal to said drain current, an averaged voltage of said first voltage and said third voltage is applied as said first applied voltage to said first transistor so as to turn said first transistor off, and an averaged voltage of said second voltage and said fourth voltage is applied as said second applied voltage to said second transistor so as to turn said second transistor off.

2. A peak hold circuit according to claim 1, wherein a capacitor for holding charge is connected between the gates of said first and second FETs connected in common and said first electric power source.

3. A peak hold circuit according to claim 1, further comprising switching means for setting the potential of the gates of said first and second FETs connected in common to the potential of said first electric power source.

4. A peak hold circuit according to claim 1, wherein said first and second FETs are P-MOS FETS, said first transistor is an NPN transistor, and said second transistor is a PNP transistor.

5. A peak hold circuit according to claim 1, wherein said first and second FETs are P-MOS FETS, said first transistor is an N-MOS transistor, and said second transistor is a P-MOS transistor.

6. A peak hold circuit, comprising:

a current mirror circuit for generating
 a first constant-current source for causing flow of a current that is the same magnitude as an input current to an input terminal, and
 a second constant-current source for causing flow of a current that is said input current multiplied by a predetermined multiplication factor;

a first FET wherein the drain thereof is connected to said first constant-current source and the source thereof is connected to a second electric power source with lower voltage than a first electric power source;

a second FET wherein the drain thereof is connected to an output terminal and the source thereof is connected to said second electric power source and the gate thereof is connected in common with the gate of said first FET;

a two-stage serial circuit comprising first and second transistors having complementary properties, provided between said gates connected in common and said first electric power source, wherein the nodes of said first and second transistors are connected to the drain of said first FET;

current detecting means for detecting the drain current of said first FET; and applied voltage control means which compare a current which is a drain current detected by said current detecting means multiplied by said predetermined multiplication factor, with a current which is said input current from said second constant-current source multiplied by said predetermined multiplication factor, and applies a first applied voltage which is higher than voltage of said second electric power source to said first transistor, and also applies to said second transistor a second applied voltage which is constantly higher than said first applied voltage by a predetermined voltage wherein said first and second transistors are not simultaneously turned on, wherein
 in the event that said detected current detected by said current detecting means is greater than the drain current of said first FET, said first voltage is applied as said first applied voltage to said first transistor so as to turn said first transistor on, and said second voltage is applied as said second applied voltage to said second transistor so as to turn said second transistor off,
 in the event that said detected current is smaller than said drain current, a third voltage higher than said first voltage by a predetermined voltage is applied as said first applied voltage to said first transistor so as to turn said first transistor off, and a fourth voltage higher than said second voltage by a predetermined voltage is applied as said second applied voltage to said second transistor so as to turn said second transistor on, and in the event that said detected current is equal to said drain current, an averaged voltage of said first voltage and said third voltage is applied as said first applied voltage to said first transistor so as to turn said first transistor off, and an averaged voltage of said second voltage and said fourth voltage is applied as said second applied voltage to said second transistor so as to turn said second transistor off.

7. A peak hold circuit according to claim 6, wherein a capacitor for holding charge is connected between the gates of said first and second FETs connected in common and said second electric power source.

8. A peak hold circuit according to claim 6, further comprising switching means for setting the potential of the gates of said first and second FETs connected in common to the potential of said second electric power source.

9. A peak hold circuit according to claim 6, wherein said first and second FETs are N-MOS FETS, said first transistor is a PNP transistor, and said second transistor is an NPN transistor.

10. A peak hold circuit according to claim 6, wherein said first and second FETs are N-MOS FETS, said first transistor is P-MOS FET, and said second transistor is an N-MOS FET.

* * * * *

UNITED STATES PATENT AND TRADEMARK OFFICE
CERTIFICATE OF CORRECTION

PATENT NO. : 6,498,517 B2
DATED : December 24, 2002
INVENTOR(S) : Keizo Miyazaki It is certified that error appears in the above-identified patent and that said Letters Patent is hereby corrected as shown below:

Column 1,
Line 51, "he" should read -- the --.

Column 2,
Line 17, "the base the base" should read -- the base --.

Column 3,
Line 54, "co the" should read -- with the --.

Column 4,
Line 15, "VBIAS1" should read -- VBIAS2 --; and
Line 62, "M-MOS" should read -- N-MOS --.

Column 8,
Line 52, "a" (second occurrence) should read -- an --.

Column 12,
Line 24, "iin(t) 10 iin(t)," should read -- iin(t1)-iin(t), --.

Column 17,
Line 5, "In the" should read -- (3) In the --.

Column 24,
Lines 8 and 12, "FETS" should read -- FETs --.

Column 26,
Lines 6 and 10, "FETS" should read -- FETs --.

Signed and Sealed this

Seventh Day of October, 2003

JAMES E. ROGAN
*Director of the United States Patent and Trademark Office*